(12) United States Patent
Durcan et al.

(10) Patent No.: US 6,395,600 B1
(45) Date of Patent: May 28, 2002

(54) METHOD OF FORMING A CONTACT STRUCTURE AND A CONTAINER CAPACITOR STRUCTURE

(75) Inventors: D. Mark Durcan; Trung T. Doan; Roger R. Lee; Fernando Gonzalez, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/389,661

(22) Filed: Sep. 2, 1999

(51) Int. Cl.[7] .......................................... H01L 21/8242
(52) U.S. Cl. .................. 438/253; 438/254; 438/255; 438/396; 438/397; 438/398
(58) Field of Search ................................ 438/253, 254, 438/396, 397, 255, 398

(56) References Cited

U.S. PATENT DOCUMENTS

| | | | |
|---|---|---|---|
| 5,851,875 A | 12/1998 | Ping | 438/253 |
| 5,956,594 A * | 9/1999 | Yang et al. | 438/396 |
| 6,037,218 A * | 3/2000 | Dennison et al. | 438/254 |
| 6,136,643 A * | 10/2000 | Jeng et al. | 438/253 |
| 6,143,601 A * | 11/2000 | Sun | 438/253 |
| 6,300,191 B1 * | 10/2001 | Yu et al. | 438/253 |

OTHER PUBLICATIONS

U.S. Application No. 09/389,866, by D. Mark Durcan, Trung T. Doan, Roger R. Lee, Fernando Gonzalez, and Er–Xuan Ping, filed Sep. 2, 1999.

* cited by examiner

*Primary Examiner*—John F. Niebling
*Assistant Examiner*—Jennifer M. Kennedy
(74) *Attorney, Agent, or Firm*—Russell D. Slifer; Fogg Slifer Polglaze Leffert & Jay, P.A.

(57) ABSTRACT

Method for forming at least a portion of a top electrode of a container capacitor and at least a portion of a contact plug in one deposition are described. In one embodiment, the top electrode is formed interior to a bottom electrode of the container capacitor. In another embodiment, the top electrode is formed interior to, and exterior and below a portion of the bottom electrode of the container capacitor. The method of forming a top electrode of a container capacitor and a contact plug with a same deposition is particularly well-suited for high-density memory array formation.

3 Claims, 28 Drawing Sheets

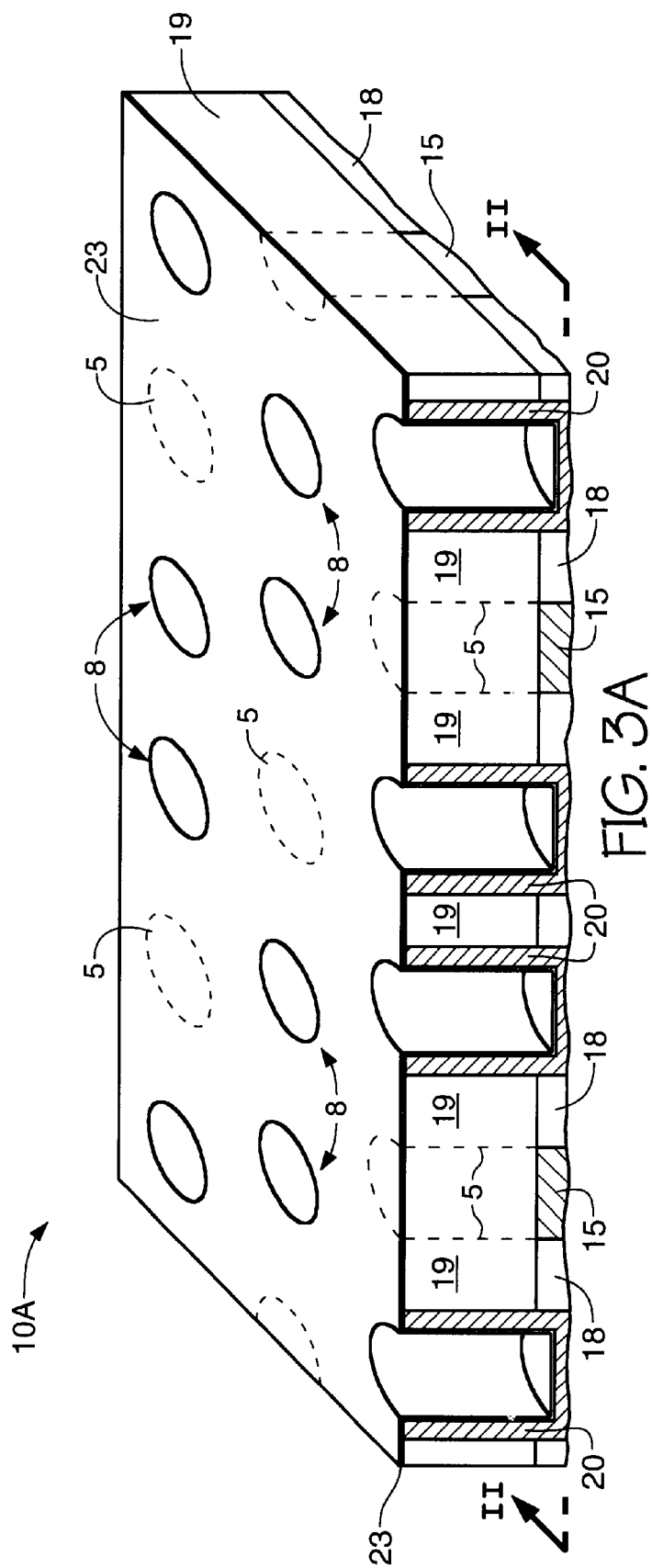

METHOD OF FORMING A CONTACT STRUCTURE AND A CONTAINER CAPACITOR STRUCTURE

FIELD OF THE INVENTION

The present invention relates generally to forming a contact structure and a capacitor structure, and more particularly to forming a contact structure and a capacitor container structure for high-density memory arrays.

BACKGROUND OF THE INVENTION

Advances in miniaturization of integrated circuits have led to smaller areas available for devices such as transistors and capacitors. For example, in semiconductor manufacture of a memory array for a dynamic random access memory (DRAM), each memory cell comprises a capacitor, a contact, and a transistor. In a conventional DRAM, pairs of memory cells are located within regions ("memory cell areas") defined by intersecting row lines ("word lines") and column lines ("bit lines" or "digit lines"). Accordingly, to increase memory cell density of the memory array, row lines and column lines are positioned with minimal spacing ("pitch"). Using minimal pitch in turn constrains memory cell area.

To increase capacitance without increasing memory cell area, the DRAM industry has shifted from planar capacitor structures (e.g., "parallel plate capacitors") to vertical capacitor structures (e.g., "container capacitors"). As suggested by its name, a "container capacitor" in may be envisioned as two cup-shaped electrodes, one at least partially stacked within the other, separated by a dielectric layer or layers. Accordingly, container capacitor electrodes provide more common surface area within a memory cell area than its planar counterpart, and thus, container capacitors do not have to occupy as much memory cell area as their planar counterparts in order to provide an equivalent capacitance.

However, in a high-density memory array architecture (by high-density memory array architecture, it is meant a memory array with a bit line-to-bit line pitch equal to or less than 0.5 microns), there is little space to form container capacitor structures and associated contact structures. More particularly, in a high-density memory array architecture, gaps between contacts and container capacitor bottom electrodes are about 200 nm or less, and gaps between adjacent container capacitor bottom electrodes are about 620 nm or less.

Thus, it is difficult to deposit container capacitor dielectric and top electrode layers without interfering with formation of one or more contact structures. Moreover, while not wishing to be bound by theory, it is believed that owing to stress migration and nearness between a container capacitor top electrode and one or more contact plugs, electrical shorting between the two may result.

Thus, there is a need in the art to provide a method of forming a contact structure and a container capacitor structure that may be used in forming a high-density memory array.

SUMMARY OF THE INVENTION

Accordingly, the present invention provides a method for forming at least a portion of a capacitor electrode and at least a portion of a contact plug, as well as providing devices resulting therefrom. One exemplary embodiment provides a method in which at least a portion of a top electrode of a container capacitor and a contact plug are formed in a common deposition step. In a more specific exemplary process embodiment, the deposition forms the top electrode on the interior of the container capacitor bottom electrode. In an alternate embodiment, the deposition forms the top electrode on the interior and exterior of the container capacitor bottom electrode. In yet another exemplary embodiment, the exterior part of the top electrode is formed only on a portion of the bottom electrode facing away from the contact plug. Exemplary apparatus embodiments include cells having a container capacitor, a plug capacitor, or other vertical or at least non-planar capacitors. Exemplary embodiments such as these are particularly well-suited for use in forming high-density memory arrays.

BRIEF DESCRIPTION OF THE DRAWINGS

Features and advantages of the present invention will become more apparent from the following description of the preferred embodiments described below in detail with reference to the accompanying drawings where.

DESCRIPTION OF THE PREFERRED EMBODIMENTS

In the following detailed Description of the Preferred Embodiments section, reference is made to the accompanying drawings which form a part of this disclosure, and which, by way of illustration, are provided for facilitating understanding of the exemplary embodiments. It is to be understood that embodiments, other than the exemplary embodiments disclosed herein, may be practiced without departing from the scope of the present invention. The following exemplary embodiments, directed to manufacture of dynamic random access memories (DRAMs) as well as the DRAM devices themselves, are provided to facilitate understanding of the present invention. Accordingly, some conventional details with respect to the manufacture and structure of DRAMs have been omitted to more clearly describe the exemplary embodiments herein.

Figure 1:
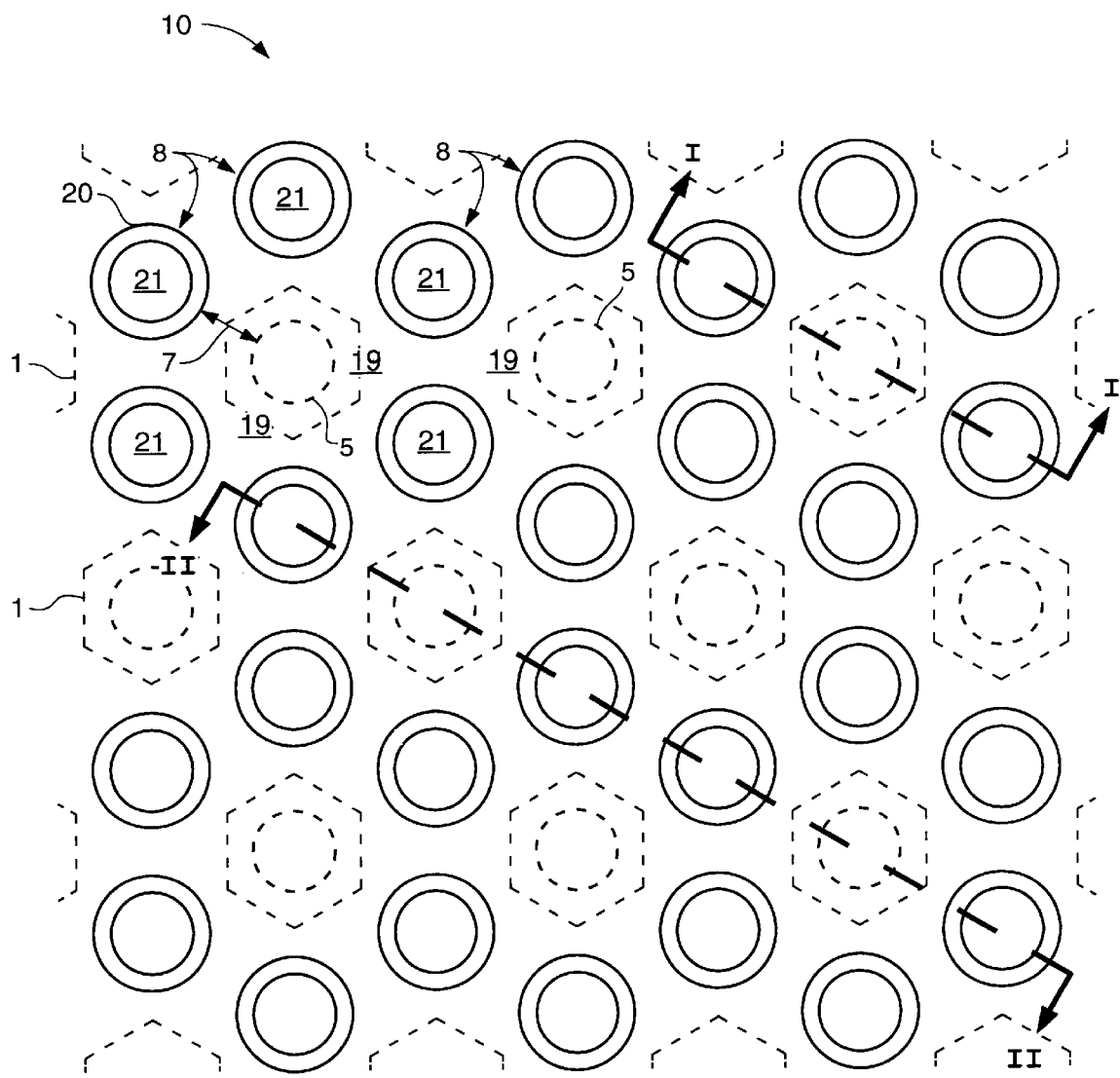
FIGS. 1–8 illustrate a first exemplary process embodiment of the current invention from various viewpoints as well as a resulting device serving as a first exemplary apparatus embodiment.
Figure 6A:
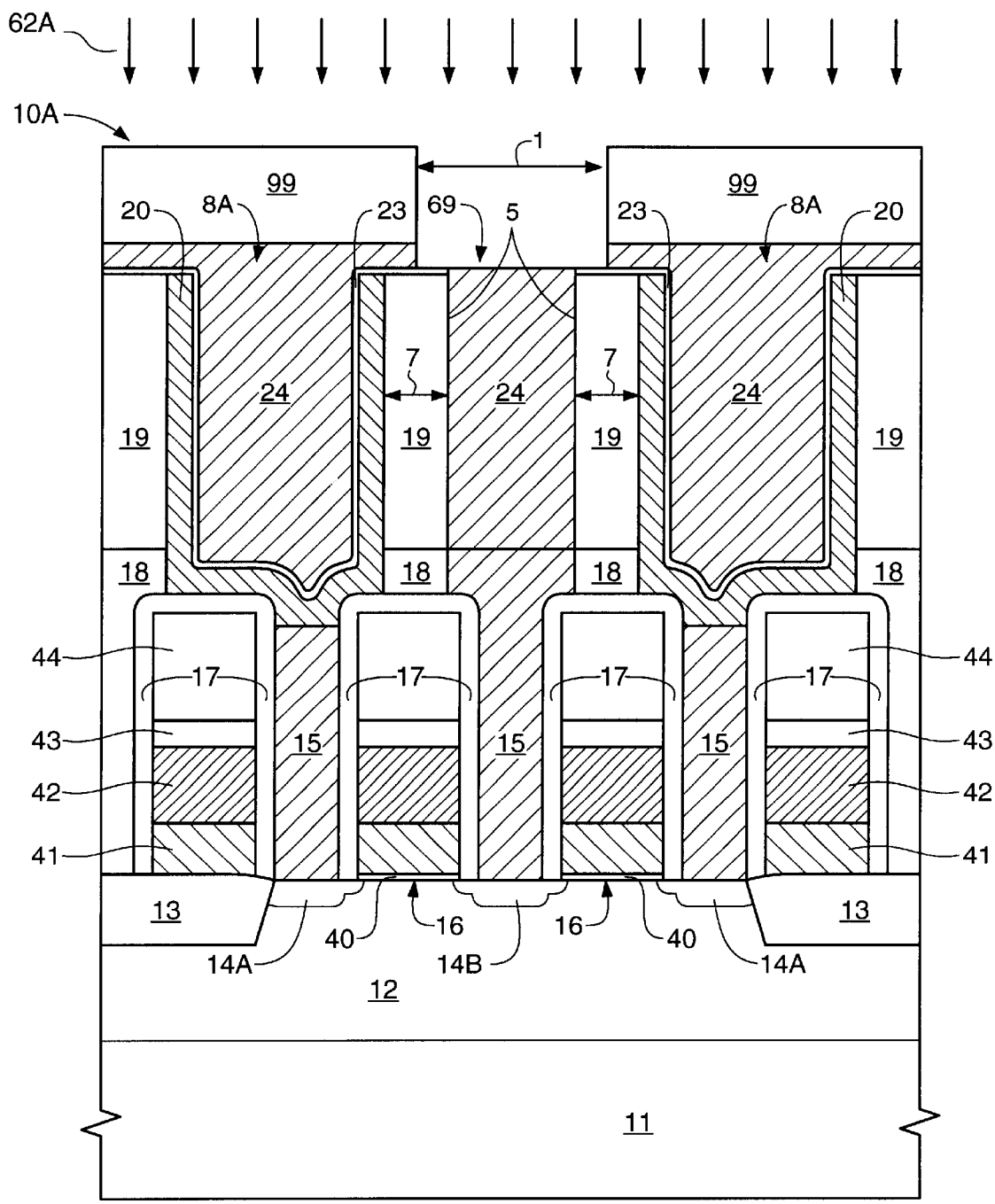
Figure 6B:
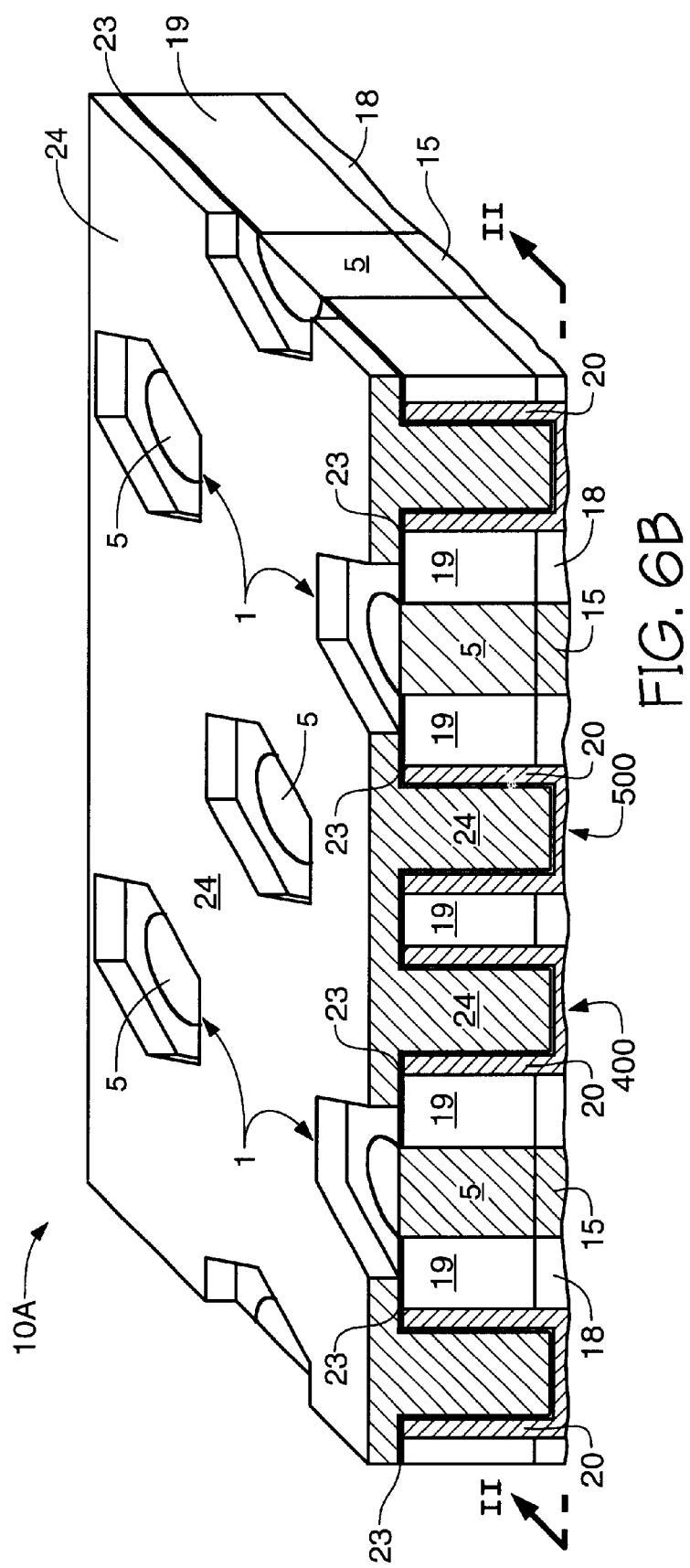
Figure 10:
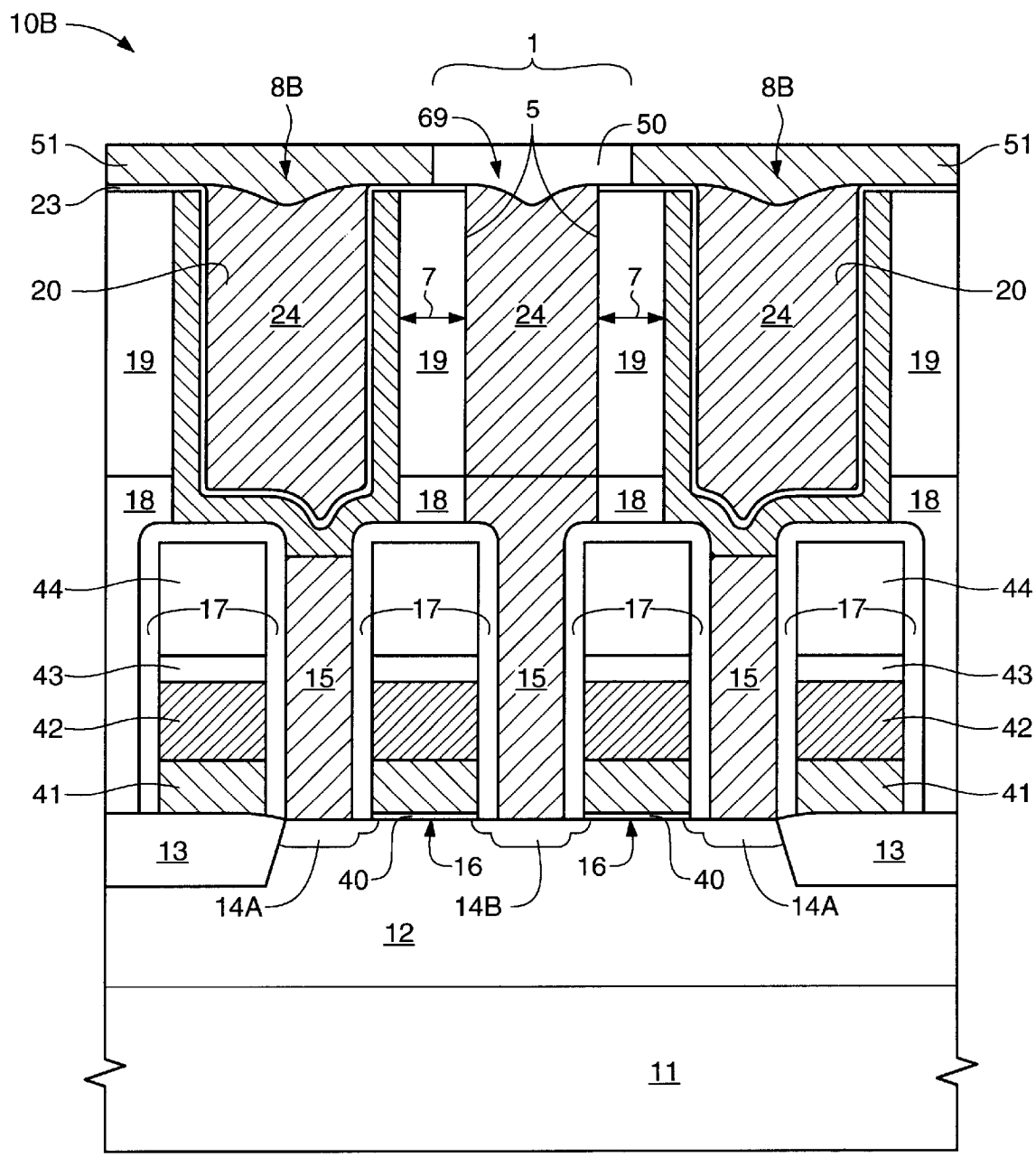
Figure 19:
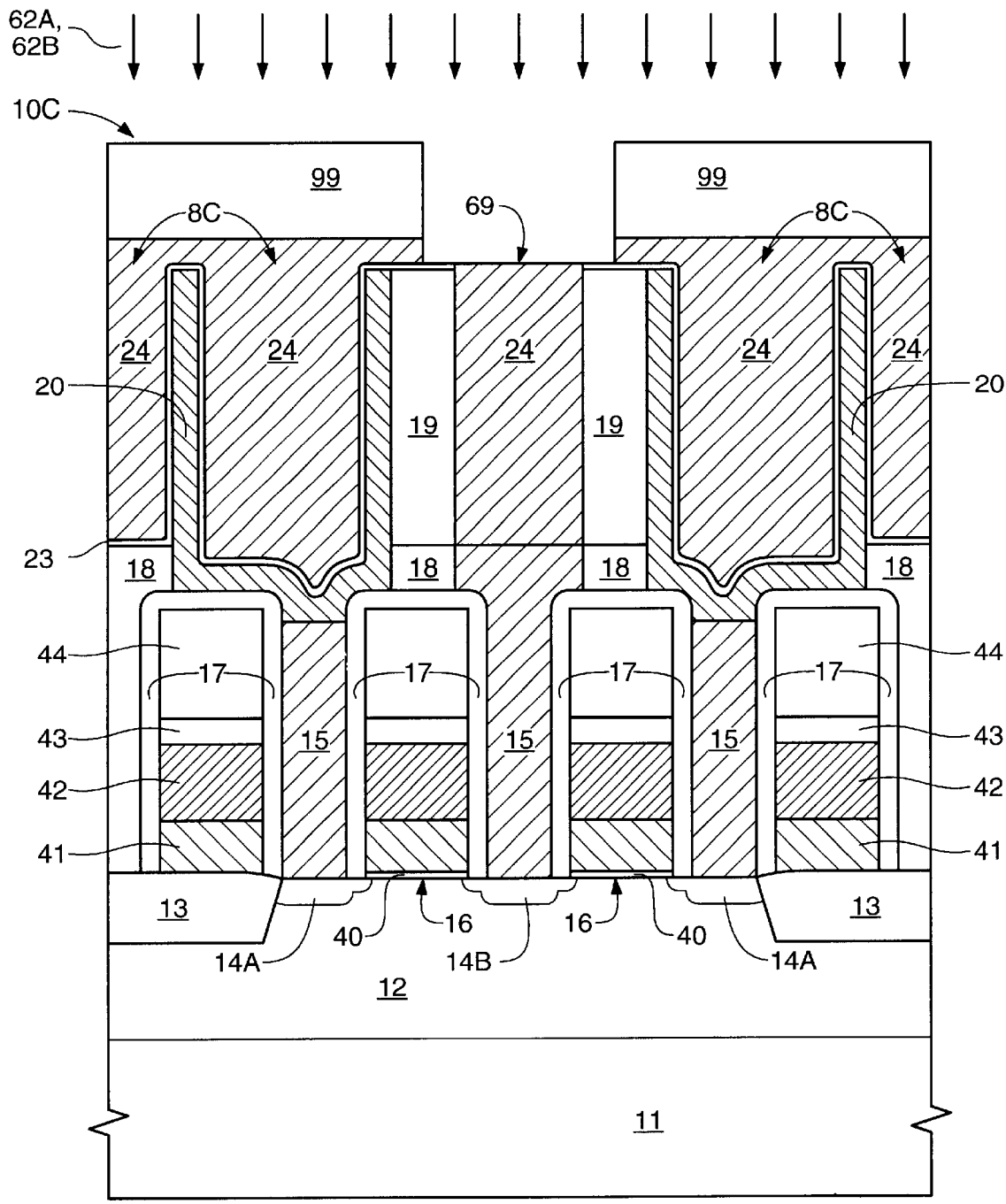
Figure 21:
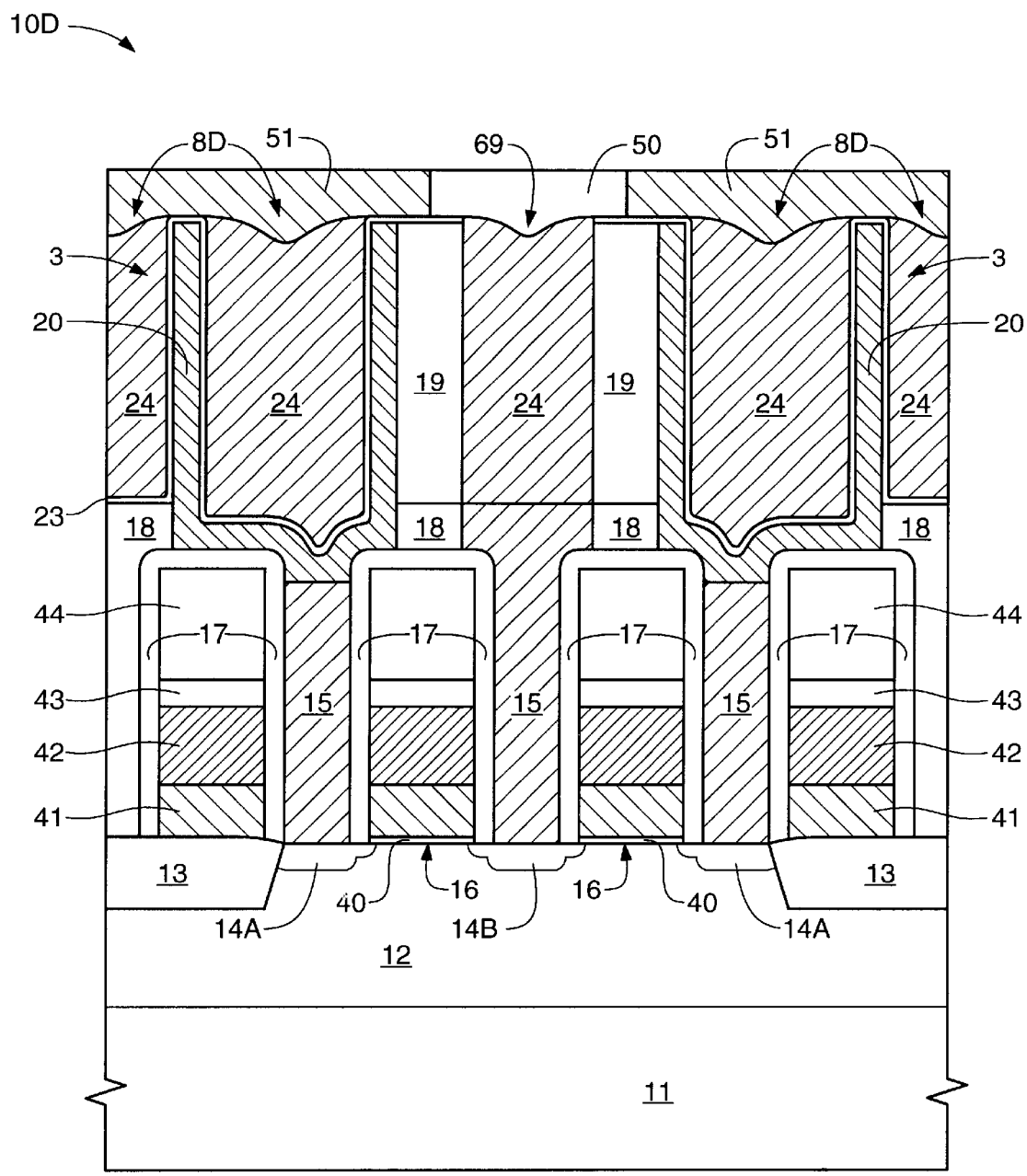

FIG. 1 is a top elevational view of an exemplary portion of an embodiment of a substrate assembly 10 that forms a portion of a memory array in accordance with an embodiment of the present invention. By substrate assembly, it is meant a substrate having one or more layers formed thereon or therein. Further, in the current application, the term "substrate" or "semiconductor substrate" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). Further, the term "substrate"

also refers to any supporting structure including, but not limited to, the semiconductive substrates described above. Bottom electrodes of in-process capacitor container cells 8 are formed in insulating dielectric layer 19. Conventionally, conductive layer 20 is conformally deposited in recesses of dielectric layer 19 to form bottom electrodes. Flow-fill material 21 is subsequently deposited and used to protect a bottom electrode's interior surface. Contact sites 5 designate a contact's current or eventual location. Dashed-lines 1 indicate the extent of a conductive material's encroachment toward a contact site 5. This conductive material may be integral to the conductive filling of the container capacitors (as seen in FIGS. 6A, 6B, and 19) or deposited over that filling (as seen in FIGS. 10 and 21). Distance 7 is a minimum distance from an exterior surface of a bottom electrode to an exterior surface of a contact structure. In a high-density memory array architecture, distance 7 is about 0.5 microns or less, as is the distance between adjacent bottom electrodes.

Figure 2A:
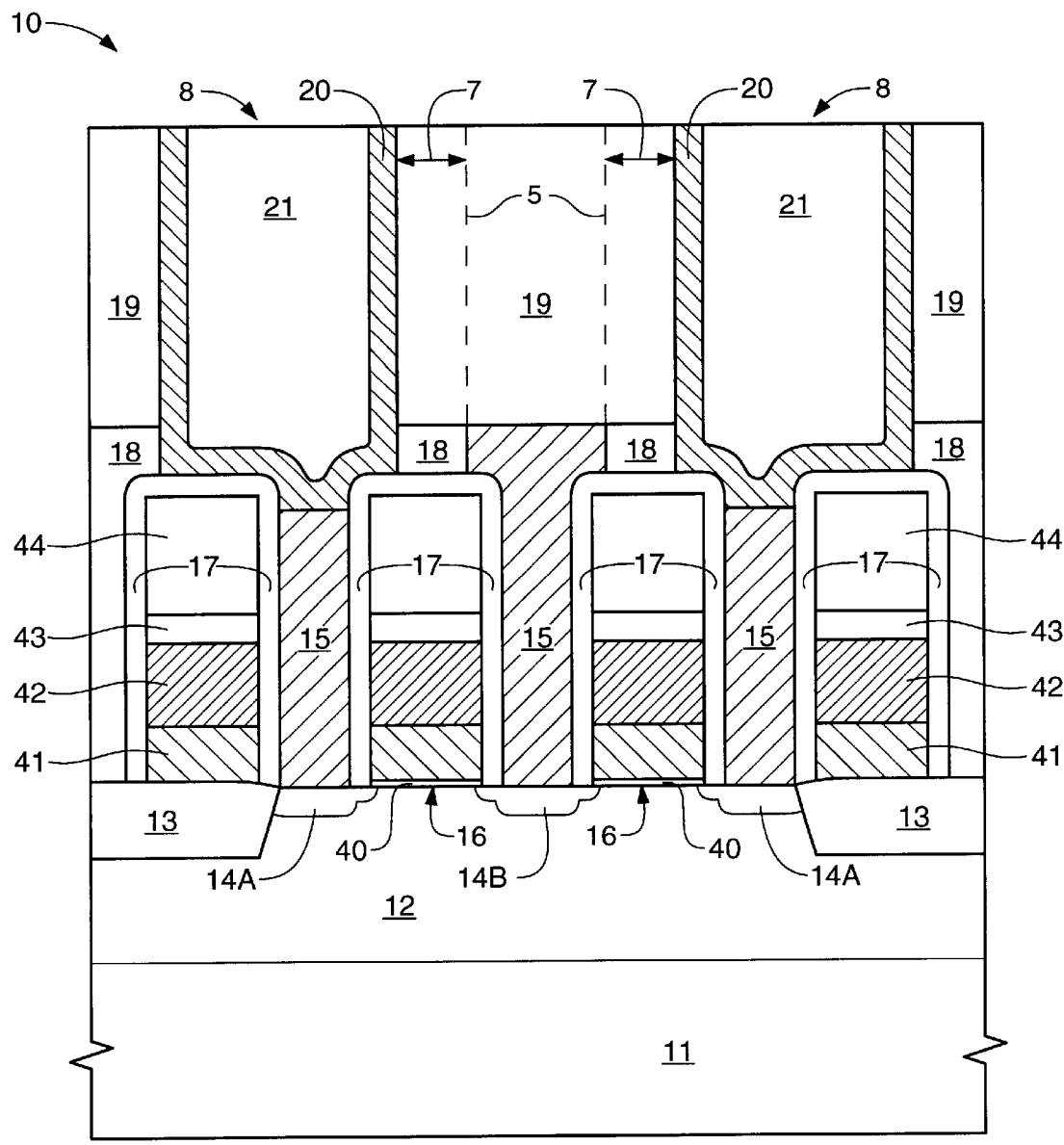

Referring to FIG. 2A, there is shown a cross-sectional view along I—I of FIG. 1 of in-process DRAM substrate assembly 10. Substrate 11 is a slice of single crystalline silicon with NMOSFETs (n-channel metal-oxide-semiconductor field effect transistors) gate stacks 16 formed thereon. Though NMOSFETs are described herein, it should be understood that alternatively P-channel MOSFETs may be used. As NMOSFETs are described, a P-well 12 is formed in substrate 11. Moreover, substrate 11 may have P-type impurities (e.g., boron) added thereto. Isolation regions 13 provide isolation from adjacent pairs of memory cells, such regions may be field oxides or shallow trench isolations (STIs). STI regions 13 may be formed in substrate 11 and filled with a combination of a thermal oxide and a chemical vapor deposition (CVD) oxide, including but not limited to a high-density plasma (HDP) oxide.

N-type source, drain and contact regions 14A and 14B, formed in P-well 12, are for transistor stacks 16 and for electrical contact to conductive studs 15. N-type regions 14A and 14B may include lightly doped drains (LDDs). Conductive studs 15 may comprise polycrystalline silicon ("polysilicon") having N-type impurities (e.g., phosphorous or arsenic) added thereto, for conductivity; however, other conductive materials may be used.

Transistor stacks 16 are formed over substrate 11. Each transistor stack 16 may comprise gate dielectric 40 (e.g., a thermal oxide), gate conductors 41 and 42 (e.g., a conductive polysilicon under tungsten silicide), dielectric anti-reflective coating (DARC) 43 (e.g., a nitride), and dielectric cap 44 (e.g., a nitride). One or both of gate conductors 41 and 42 may be used as a row line in a memory array. Spacer layer 17 is illustratively shown as covering transistor gate stack 16; however, spacer layer 17 may be etched or otherwise removed such that it is not disposed above dielectric cap 44.

Dielectric layers 18 and 19 are separate layers, which may be made of same or different materials. By way of example and not limitation, a silicon oxide having impurities ("dopants") added thereto may be used for dielectric layers 18 and 19. Impurities such as phosphorous and boron may be used to enhance flow characteristics for deposition of dielectric layers 18 and 19. Accordingly, dielectric layers 18 and 19 may comprise boro-phospho-silicate glass (BPSG) or phospho-silicate glass (PSG). Alternatively, other low dielectric constant materials may be used including but not limited to other oxides, especially porous oxides.

Conductive layer 20, which may comprise one or more layers of one or more materials, forms a cup-shaped electrode ("bottom electrode") of each container capacitor structure. By "cup-shaped," it is meant to include many container shapes having an opening, which opening has a shape selected among a circle, an oval, a square, a rectangle, a trapezoid, a triangle, or a rhombus, among other shapes. Conventionally, conductive layer 20 is formed of N-type hemispherical-grain silicon (HSG). However, a P-type material may be used. Accordingly, impurities such as boron, phosphorous or arsenic may be used. Moreover, a conductively formed polysilicon, ruthenium, ruthenium oxide, or like material may be used for conductive layer 20. Notably, a barrier layer (not shown), such as titanium nitride or tungsten nitride, may be interposed between conductive stud 15 and the conductive layer 20 of the container capacitor bottom electrode. Such a barrier limits oxidation of stud 15, especially when a conductive oxide is employed for forming conductive layer 20.

Figure 2B:
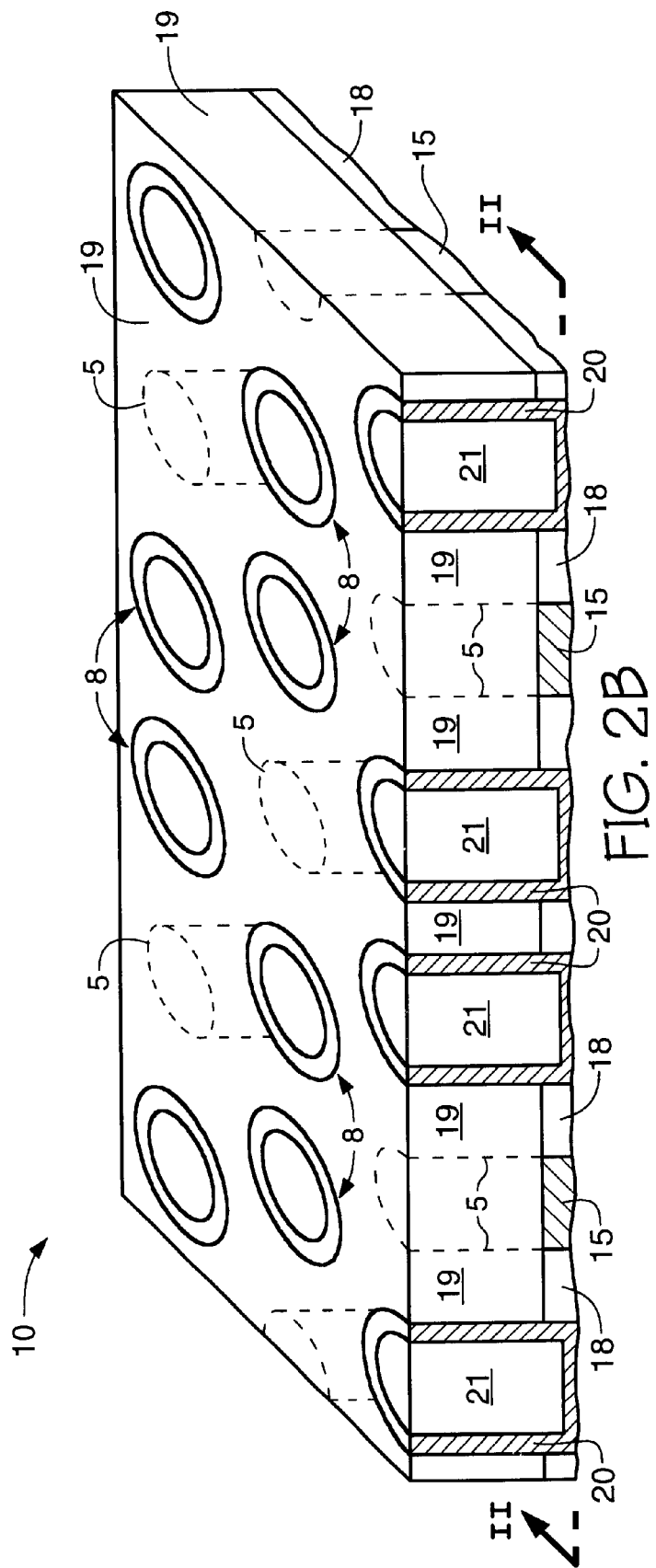

A flow-fill material layer 21, such as photosensitive polymer ("photoresist"), is disposed above conductive layer 20 to protect in-process container capacitor structures 8 from subsequent chemical-mechanical polishing (CMP) or etching. After curing flow-fill layer 21, a portion of it along with a portion of conductive layer 20 are removed by CMP or etching. Accordingly, the cross-sectional view shown in FIG. 2A is post removal of portions of conductive layer 20 and flow-fill layer 21. FIG. 2B offers another perspective of the in-process DRAM substrate assembly 10 at this stage in the form of a three-dimensional view showing a cutaway along axis II—II of FIG. 1.

FIG. 3A illustrates the DRAM substrate assembly 10A after removing flow-fill material 21 and depositing capacitor dielectric 23. Capacitor dielectric 23 is formed of one or more layers of one or more materials. Conventionally, capacitor dielectric 23 is a nitride film; however, a tantalum oxide or other high-dielectric constant material may be used. By high-dielectric constant, it is meant a dielectric constant of about 10 or greater. A nitride film equal to or less than 6 nm (60 angstroms) thick may be deposited followed by exposure to a dry or a wet oxygenated environment to seal it. In this embodiment with a nitride film equal to or less than 6 nm thick, oxygen may diffuse through it causing a silicon dioxide to form underneath. Accordingly, an oxide-nitride-oxide (ONO) thin film dielectric may be formed.

Figure 3B:
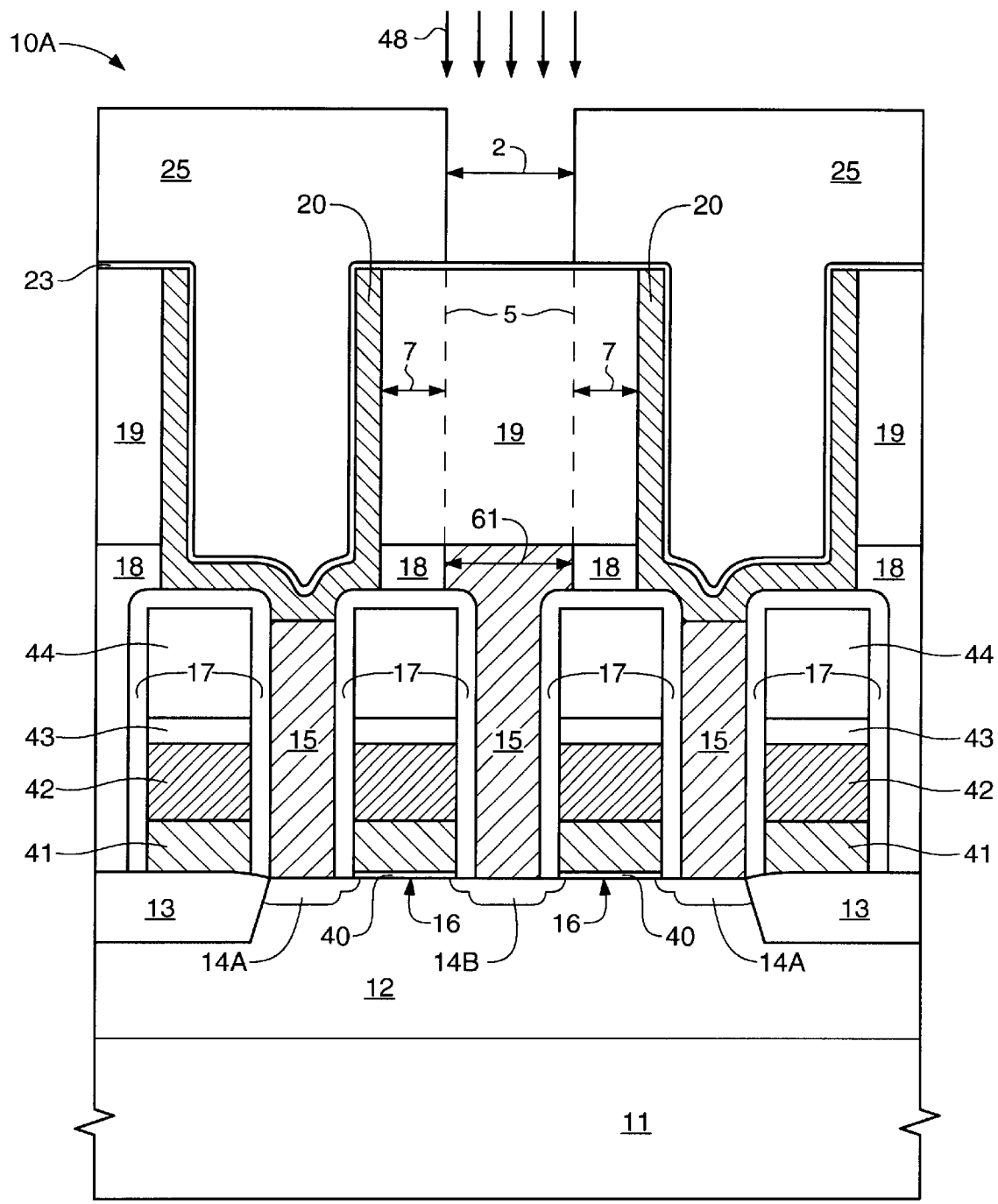
Figure 3C:
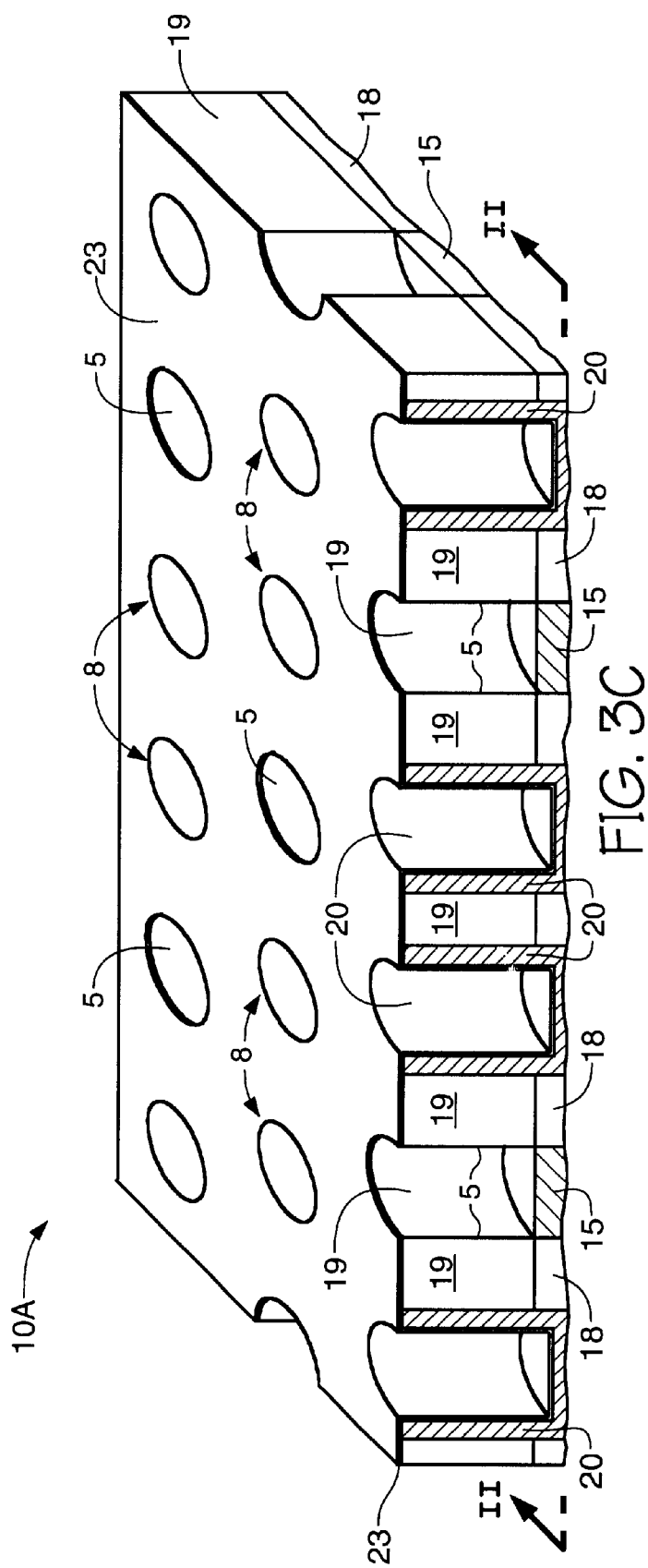

FIG. 3B indicates that, after forming capacitor dielectric 23, masking layer 25 is deposited and patterned on substrate assembly 10A. Masking layer 25 comprises one or more layers of one or more materials. Masking layer 25 may be a multilayered resist structure (MLR) or a patterned photosensitive polymer. Masking layer is used as an etch mask for etch 48. Etch 48 is used to remove an exposed portion of capacitor dielectric 23 and to form contact site 5 in dielectric layer 19. Etch 48 may also be allowed to undercut masking layer 25 so as to pull capacitor dielectric 23 away from contact site 5. Notably, width 2 may be narrower than width 61 of conductive stud 15 to reduce probability of shorting between the contact site 5 and conductive layer 20. FIG. 3C shows the state of the DRAM substrate assembly 10A after the etch 48 and after removing masking layer 25.

Figure 4:
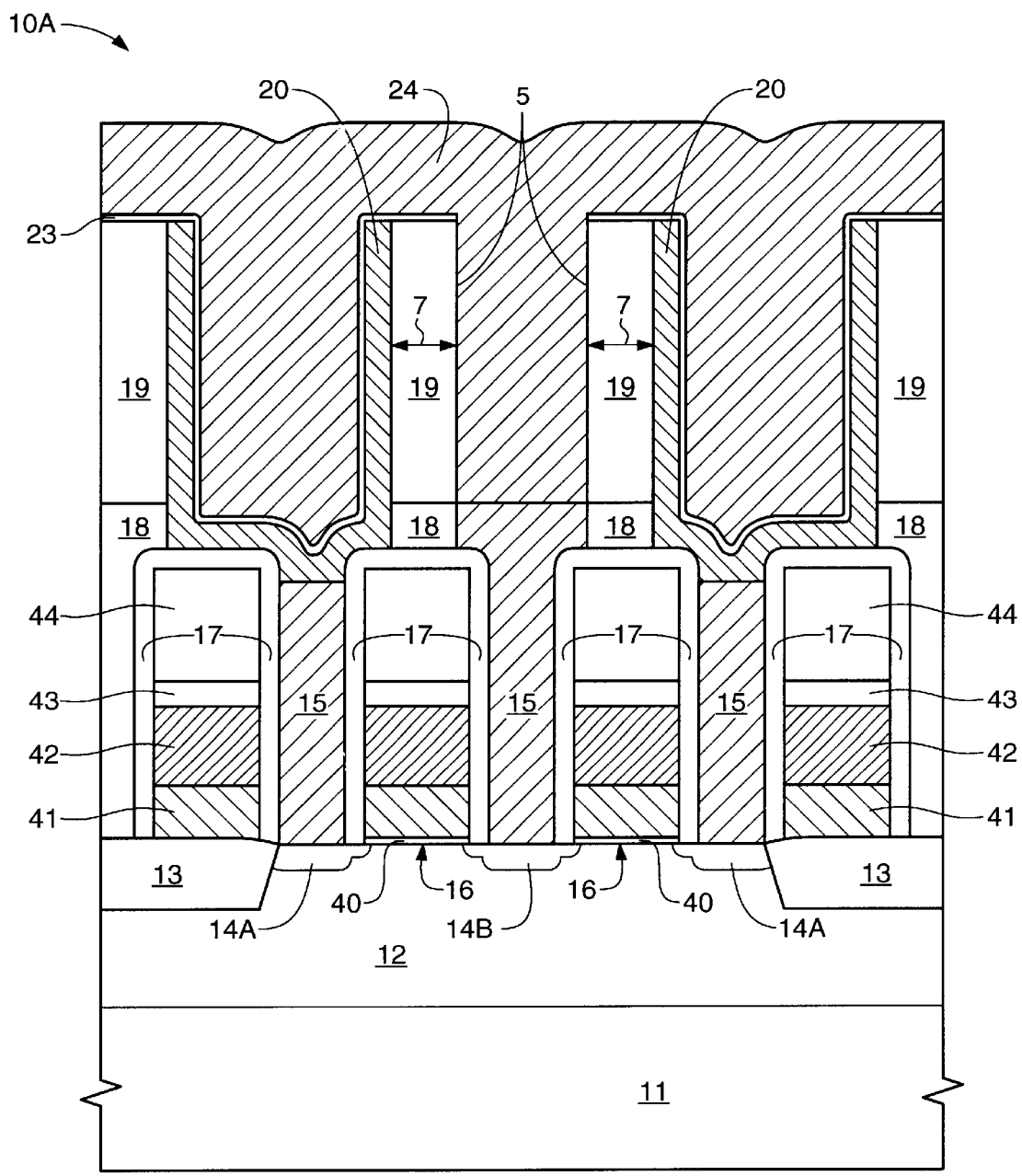

FIG. 4 is a cross-sectional view of in-process DRAM substrate assembly 10A after deposition of conductive layer 24. Conductive layer 24 is formed to provide a second electrode ("top electrode") of each container capacitor structure and to provide contact structures. Conductive layer 24 may comprise one or more layers of one or more materials. A polysilicon, with N-type or P-type impurities added thereto for conductivity, may be used for conductive layer 24. However, a platinum, ruthenium, ruthenium oxide, or like material may be used. Notably, it should be appreciated that, in a single deposition step, conductive layer 24 fills at least a portion of contact site 5 and forms at least a portion of a container capacitor's top electrode. Conductive layer 24 is illustratively shown as having been deposited by CVD or sputtering. A conductive material, such as a conductive polymer may be used instead as a flow-fill material to avoid or reduce subsequent removal of a portion of conductive layer 24 interior to bottom electrode 20 or portions interior to holes 5.

Figure 5A:
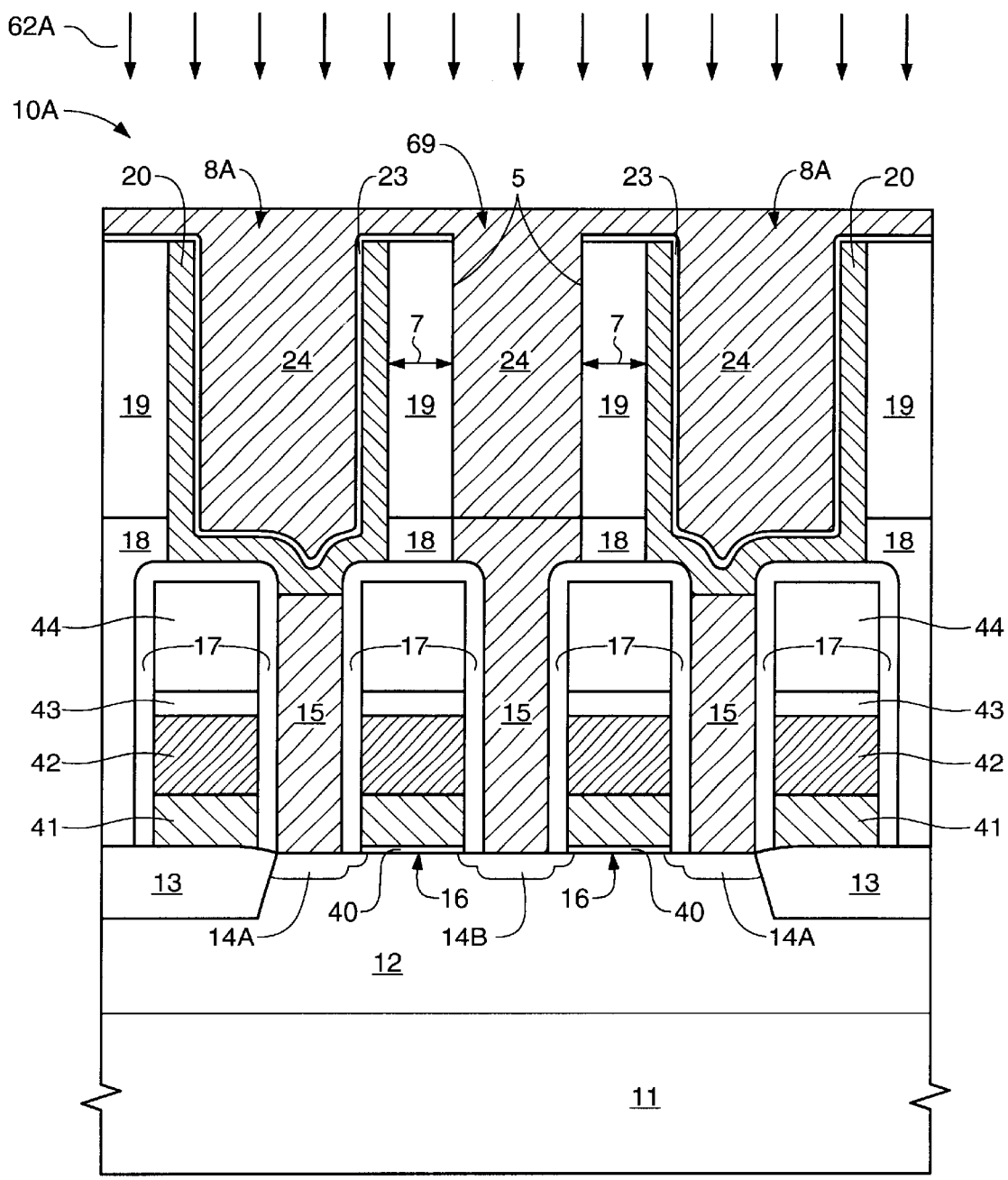
Figure 5B:
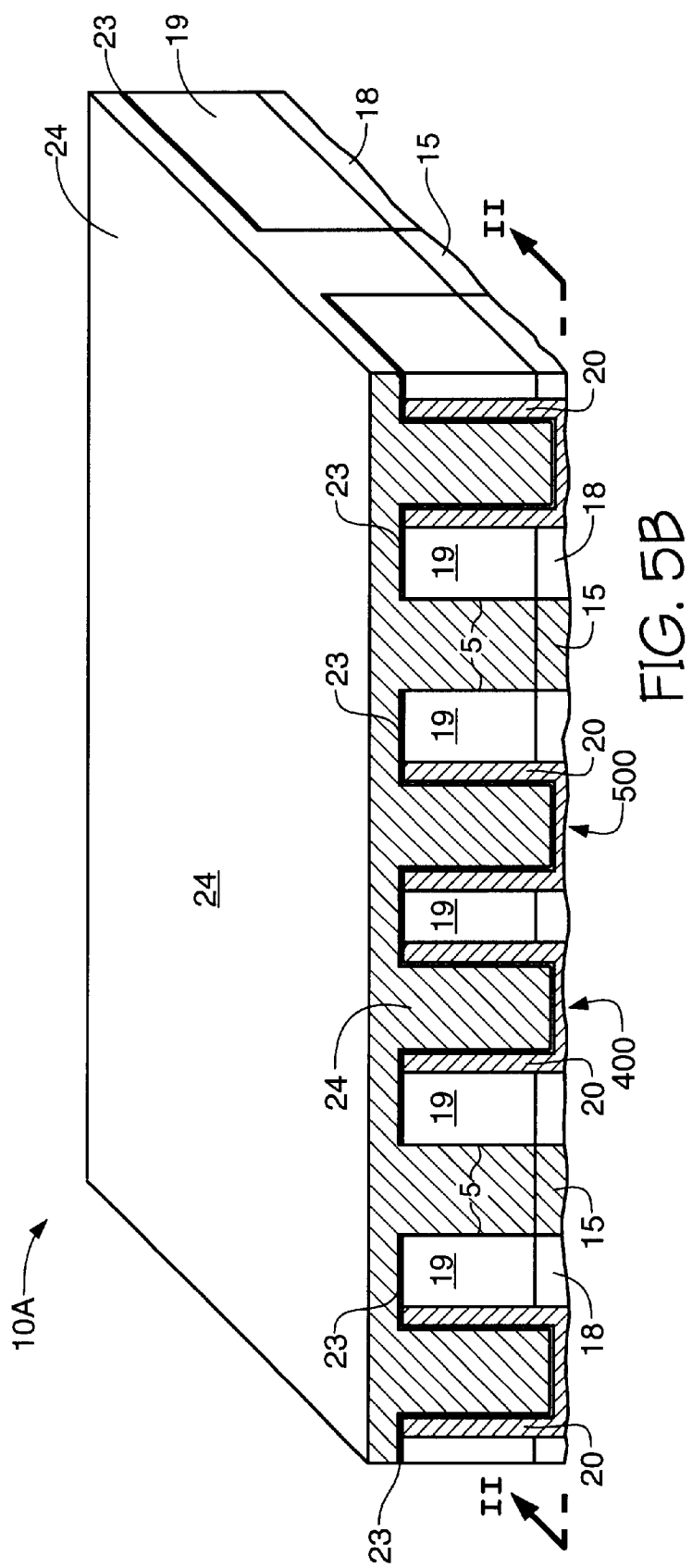

FIG. 5A is a cross-sectional view of an embodiment of in-process DRAM substrate assembly 10A after using etch 62A to remove a portion of conductive layer 24. Alternatively, CMP may be used instead of etch 62A. Notably, an upper portion of conductive layer 24 is left connecting a capacitor top electrode to a contact plug. FIG. 5B offers an alternate view of the in-process DRAM substrate assembly 10A at this stage. Referring to FIG. 6A, there is shown a cross-sectional view of in-process DRAM substrate assembly 10A after depositing and patterning masking layer 99 and after carrying out an etch 62A to remove an exposed portion of conductive layer 24. FIG. 6B illustrates the substrate assembly 10A after the masking layer 99 has been removed. As in FIG. 1, element 1 indicates the extent of the conductive layer's 24 encroachment toward contact sites 5. Although the conductive layer 24 defines a hexagon around each contact site 5 in this figure, the current invention is not limited to defining one particular shape around the contact sites 5.

Figure 7:
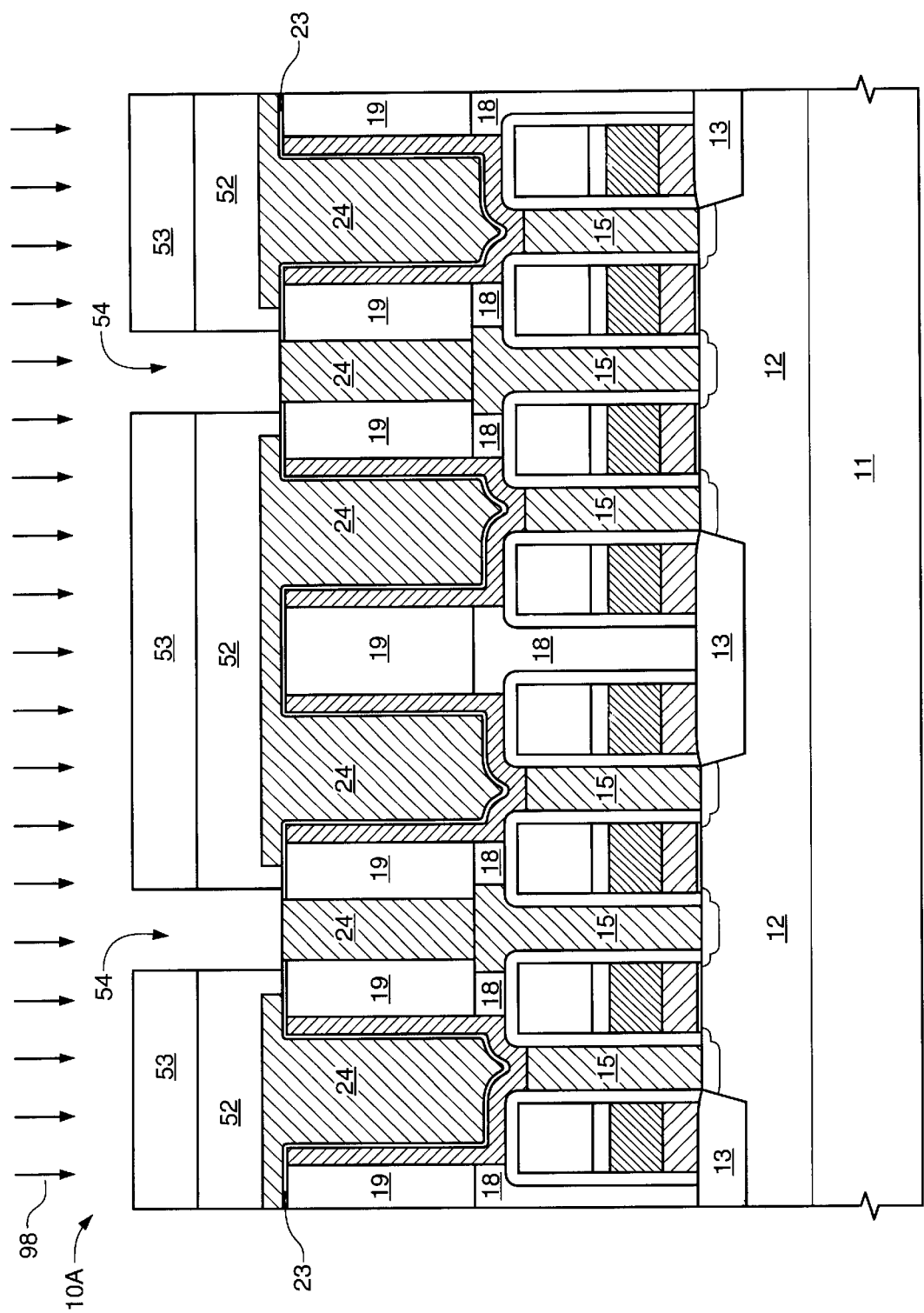

FIG. 7 is a cross-sectional view along II—II of the in-process DRAM substrate assembly 10A after depositing dielectric layer 52 and masking layer 53. Dielectric layer 52 is deposited and then may be planarized by CMP. Dielectric layer 52 may be a silicon oxide such as TEOS, BPSG, PSG, or the like. Photosensitive polymer 53 is deposited and patterned on dielectric layer 52. After patterning photosensitive polymer layer 53, dielectric layer 52 is etched by etch 98 to form bit line trenches 54. Etch 98 may be selective to material forming capacitor dielectric layer 23.

Figure 8:
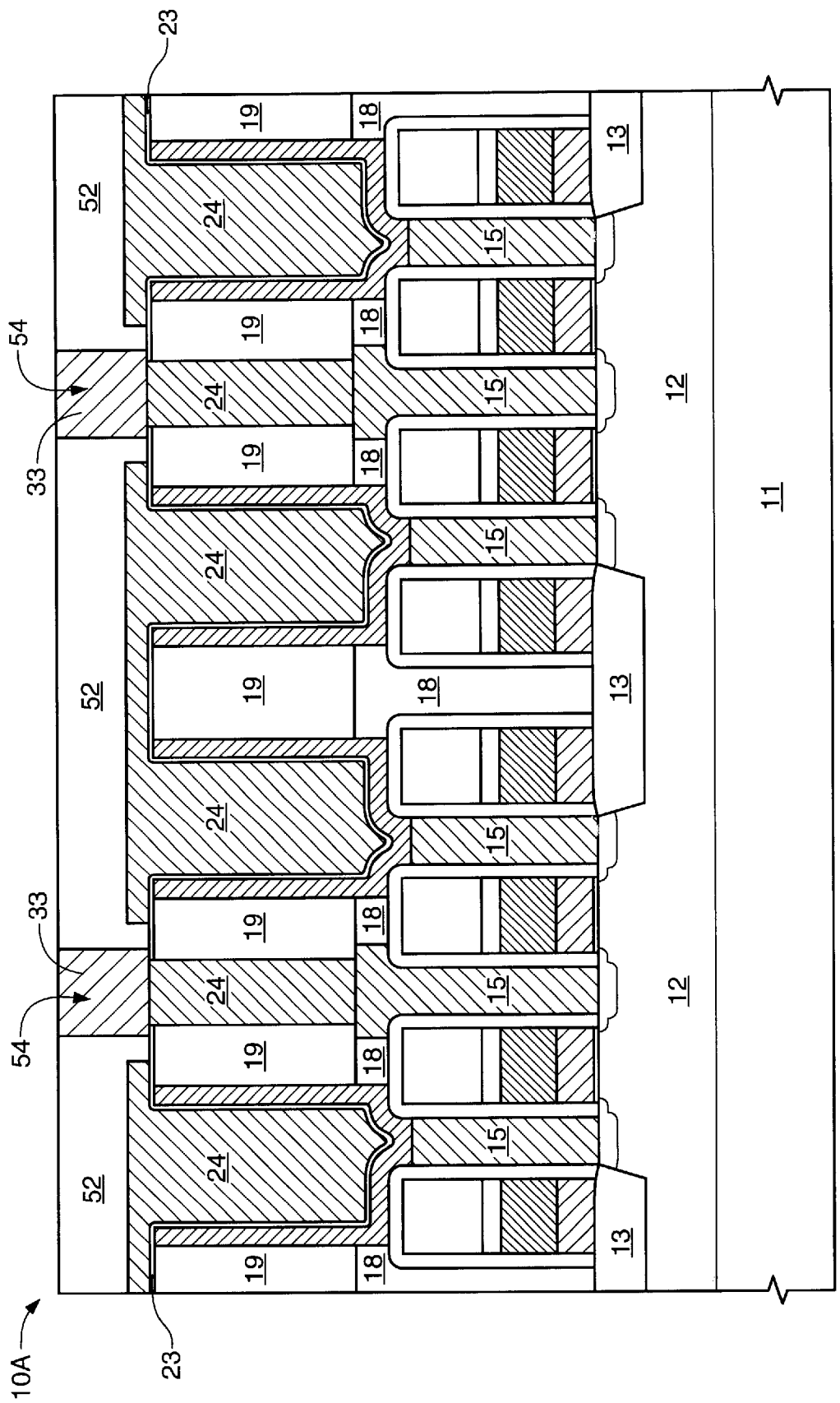

Referring to FIG. 8, there is shown a cross-sectional view of the in-process DRAM substrate assembly 10A after removal of etch mask 53 and deposition of conductive layer 33. Conductive layer 33 may be deposited and then polished or etched back, as in a damascene process (as illustratively shown), or may be deposited and then etched as in a photo-etch process (not shown).

Figure 9:
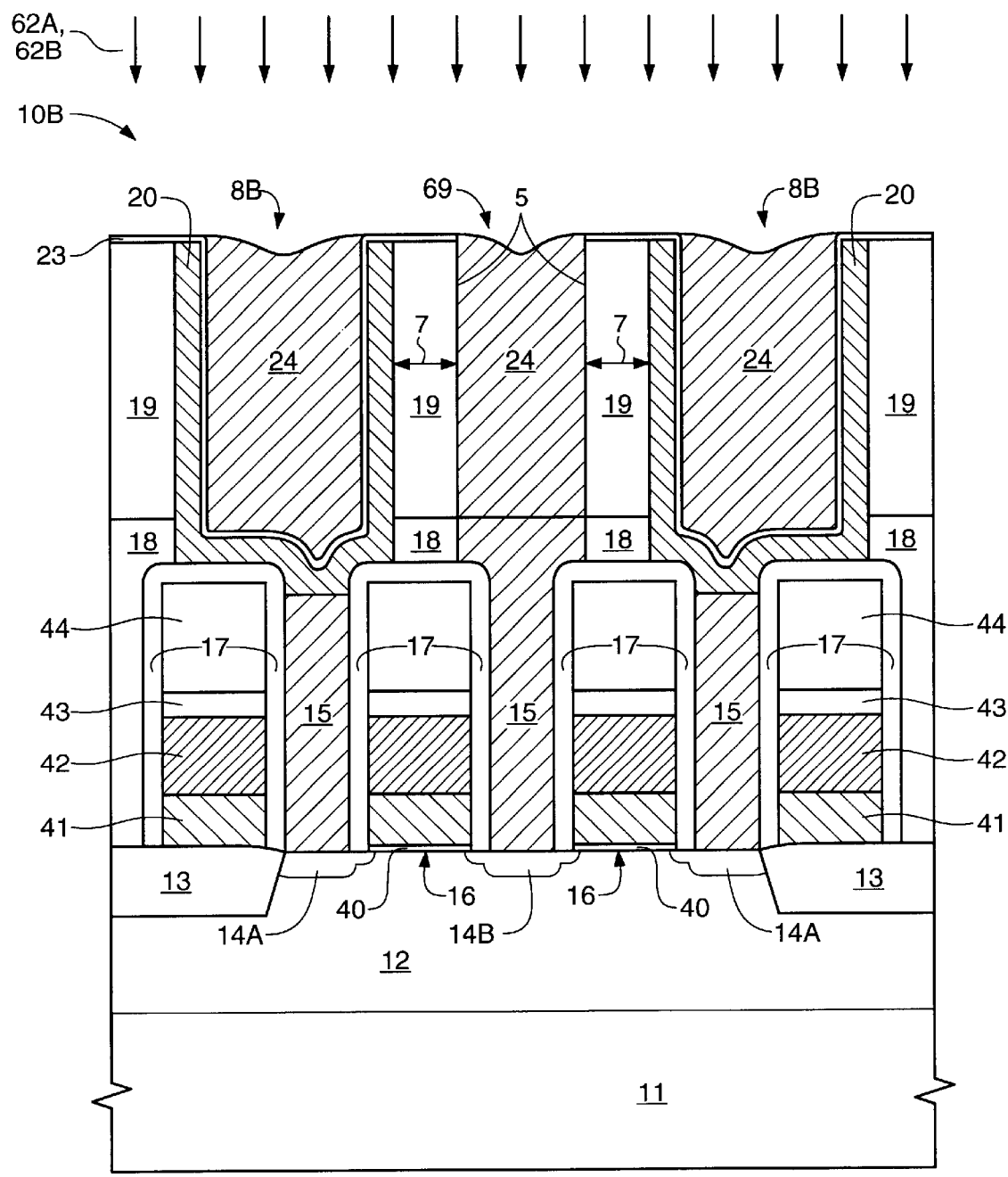
FIGS. 9–12 depict a second exemplary process embodiment of the current invention from various viewpoints as well as a resulting device serving as a second exemplary apparatus embodiment.

The current invention includes other embodiments within its scope. For example, one may carry out the process as described up to and including the step depicted in FIG. 5A using etch 62A to remove an upper portion of conductive layer 24 and leave an upper portion of capacitor dielectric 23. However, rather than allowing that upper portion of conductive layer 24 to remain, one may choose the option depicted in FIG. 9, wherein etch 62A is continued or a different etch 62B is initiated. The etch chosen should be selective to capacitor dielectric 23 material. The chosen etch leaves a portion of capacitor dielectric 23 above conductive layer 20 and disconnects a top electrode of container capacitor 8B from contact plug 69.

Referring to FIG. 10, there is shown a cross-sectional view of the in-process DRAM substrate assembly 10B after depositing dielectric layer 50 and conductive layer 51. Dielectric layer 50 is initially deposited in a continuous layer. It may be BPSG, PSG, TEOS, or another material with a dielectric constant less than 5. Further, dielectric layer 50 may be deposited by CVD or sputtering. An etch mask (not shown) is then deposited and patterned over dielectric layer 50. An etch (not shown), selective to material forming capacitor dielectric 23, is used to remove an exposed portion of dielectric layer 50. The etch mask may then be removed, and conductive layer 51 deposited over dielectric layer 50. Conductive layer 51 may comprise one or more layers of one or more materials. A polysilicon, with N-type or P-type impurities added thereto for conductivity, may be used for conductive layer 51. However, a platinum, ruthenium, ruthenium oxide, or like material may be used. After depositing conductive layer 51, it may be chemically-mechanically-polished or etched back to expose dielectric layer 50. Alternatively, conductive layer 51 may be deposited prior to dielectric layer 50.

Figure 11:
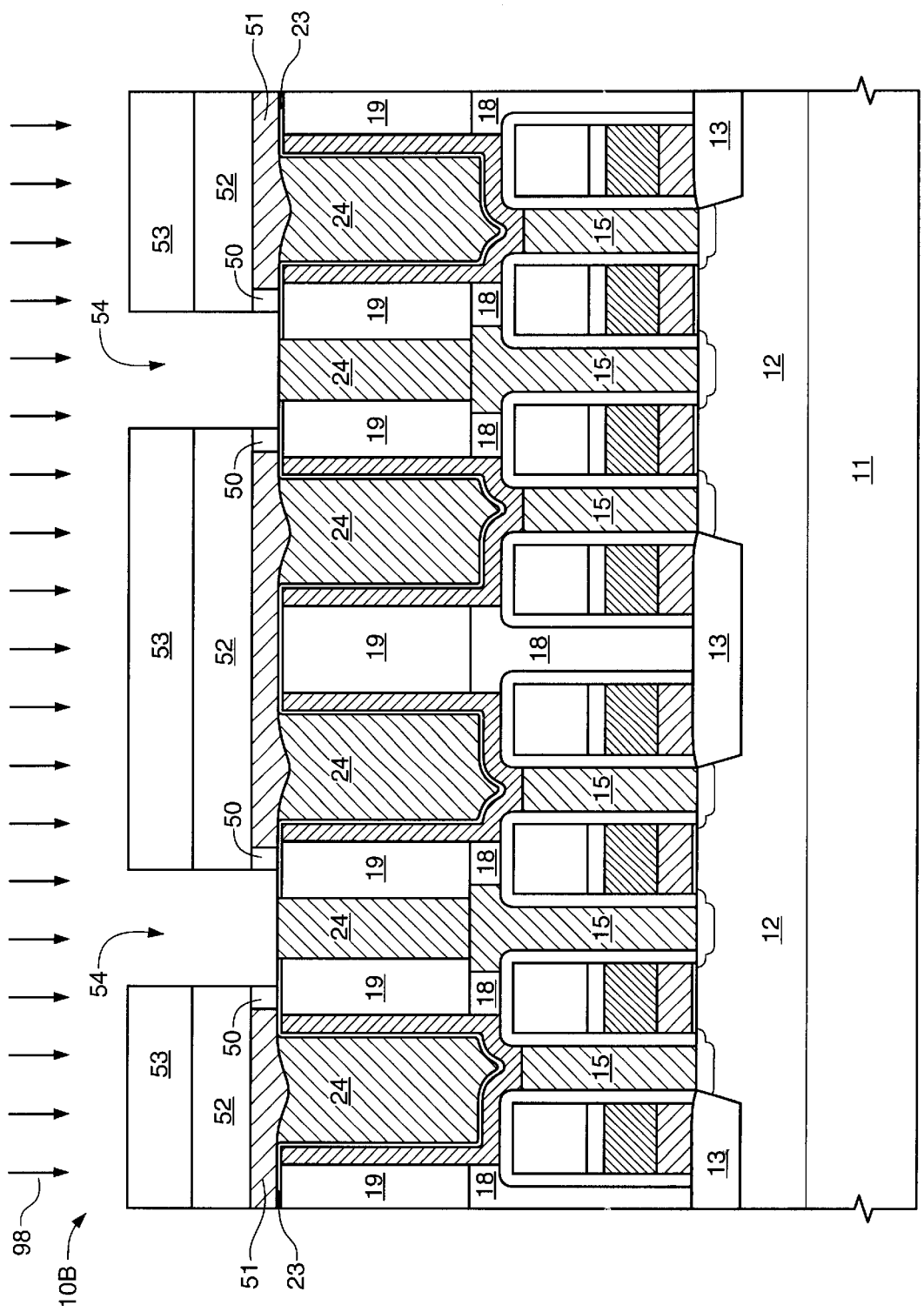

FIG. 11 is a cross-sectional view along II—II of the in-process DRAM substrate assembly 10B after depositing dielectric layer 52 and masking layer 53. As in the previous embodiment, dielectric layer 52 is deposited and then may be planarized by CMP. Dielectric layer 52 may be a silicon oxide such as TEOS, BPSG, PSG, or the like. Photosensitive polymer 53 is deposited and patterned on dielectric layer 52. After patterning photosensitive polymer layer 53, dielectric layer 52 is etched by etch 98 to form bit line trenches 54. Etch 98 may be selective to material forming capacitor dielectric layer 23.

Figure 12:
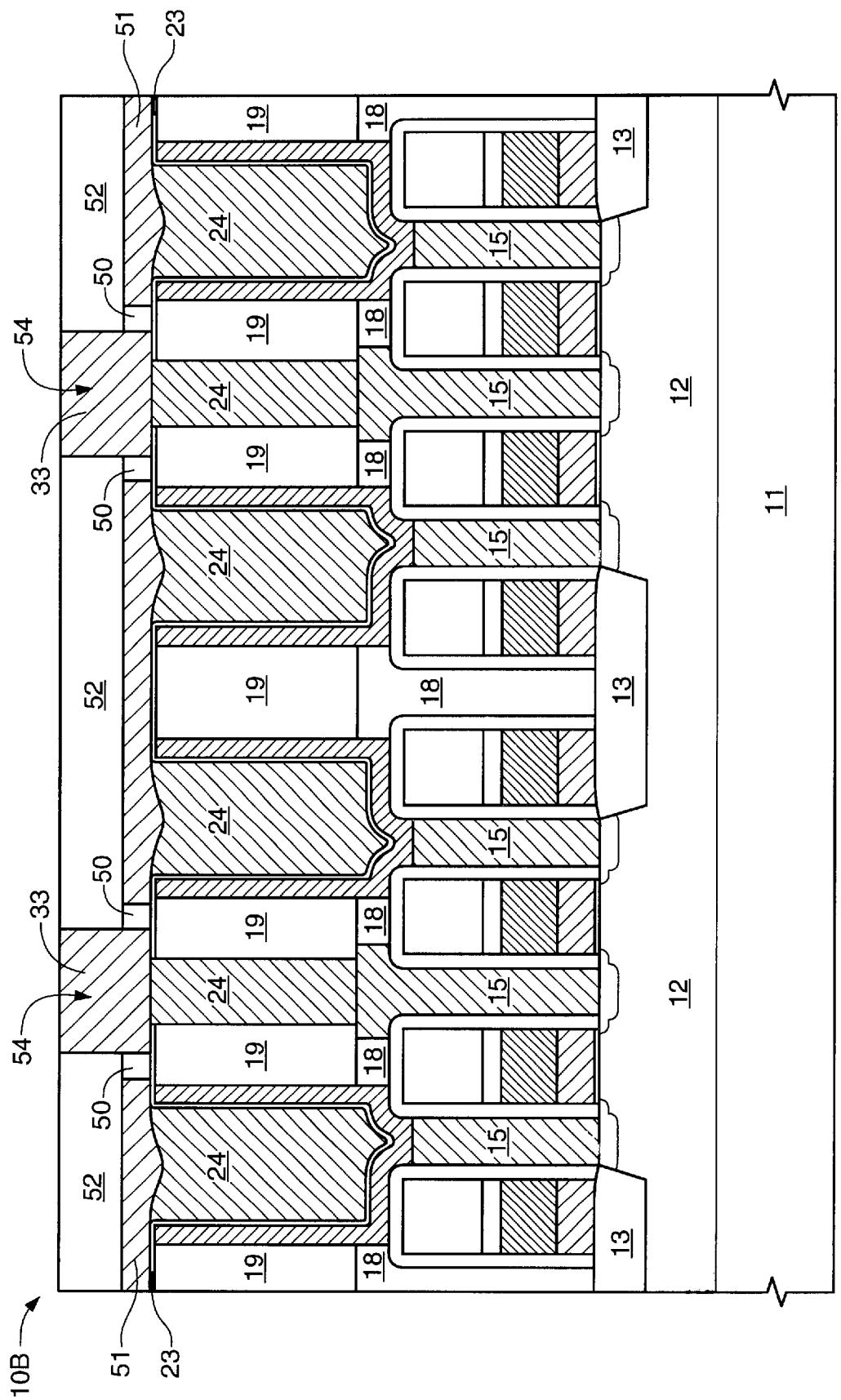

Referring to FIG. 12, there is illustrated a cross-sectional view of in-process DRAM substrate assembly 10B after removal of etch mask 53 and deposition of conductive layer 33. In a manner similar to the previously described embodiment, conductive layer 33 may be deposited and then polished or etched back, as in a damascene process (as illustratively shown), or may be deposited and then etched as in a photo-etch process (not shown).

Figure 13:
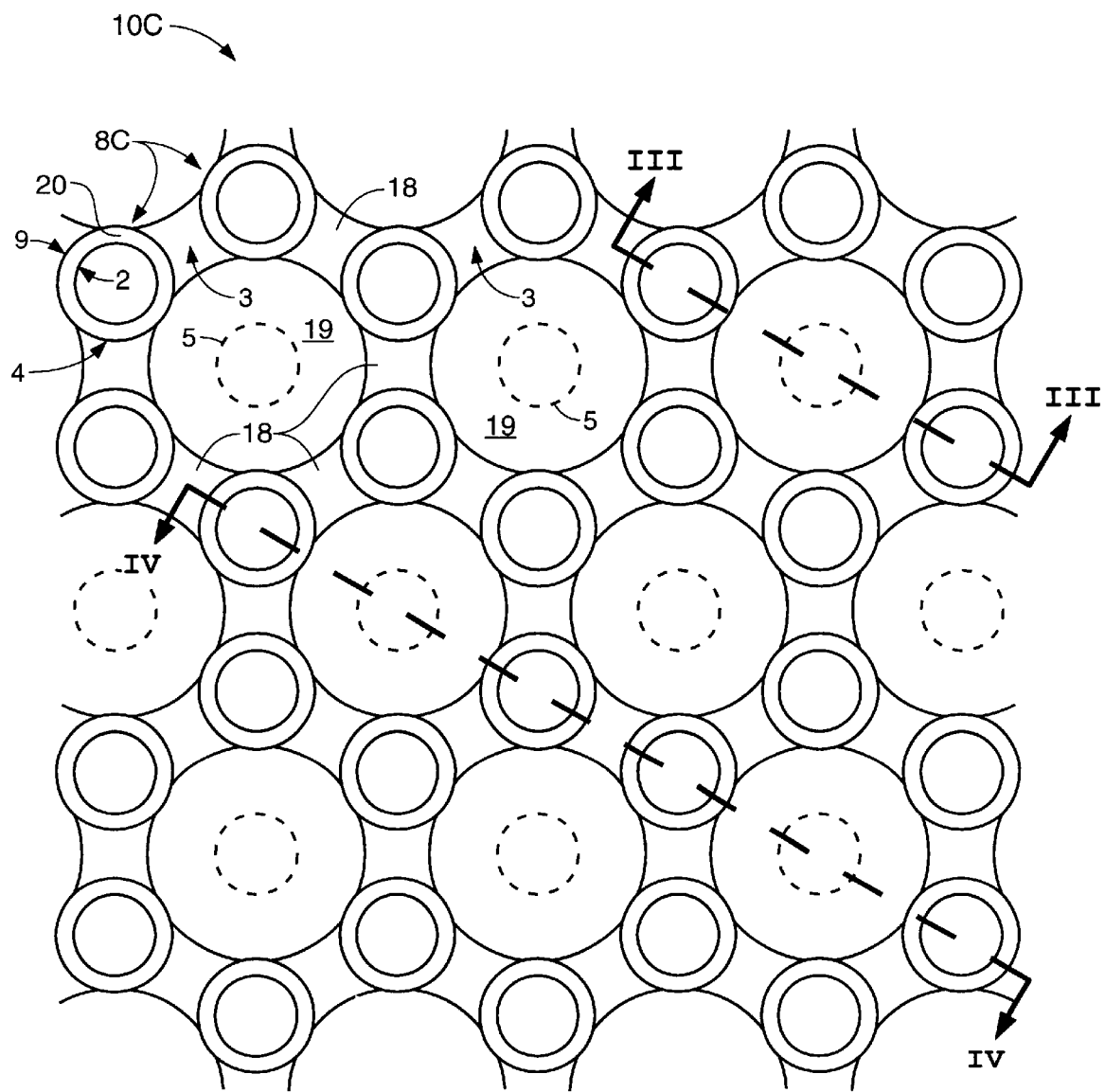
FIGS. 13–19 show a third exemplary process embodiment of the current invention from various viewpoints.

A third exemplary process is illustrated beginning with FIG. 13, which shows an in-process DRAM substrate assembly 10C having recesses 3 formed in dielectric layer 19. Such recesses can be formed by masking, patterning, and etching steps generally known in the art, although it has not been known to apply these steps in the manner described herein. What results are discrete portions of dielectric layer 19 between a contact site 5 and its surrounding bottom electrodes.

Figure 14:
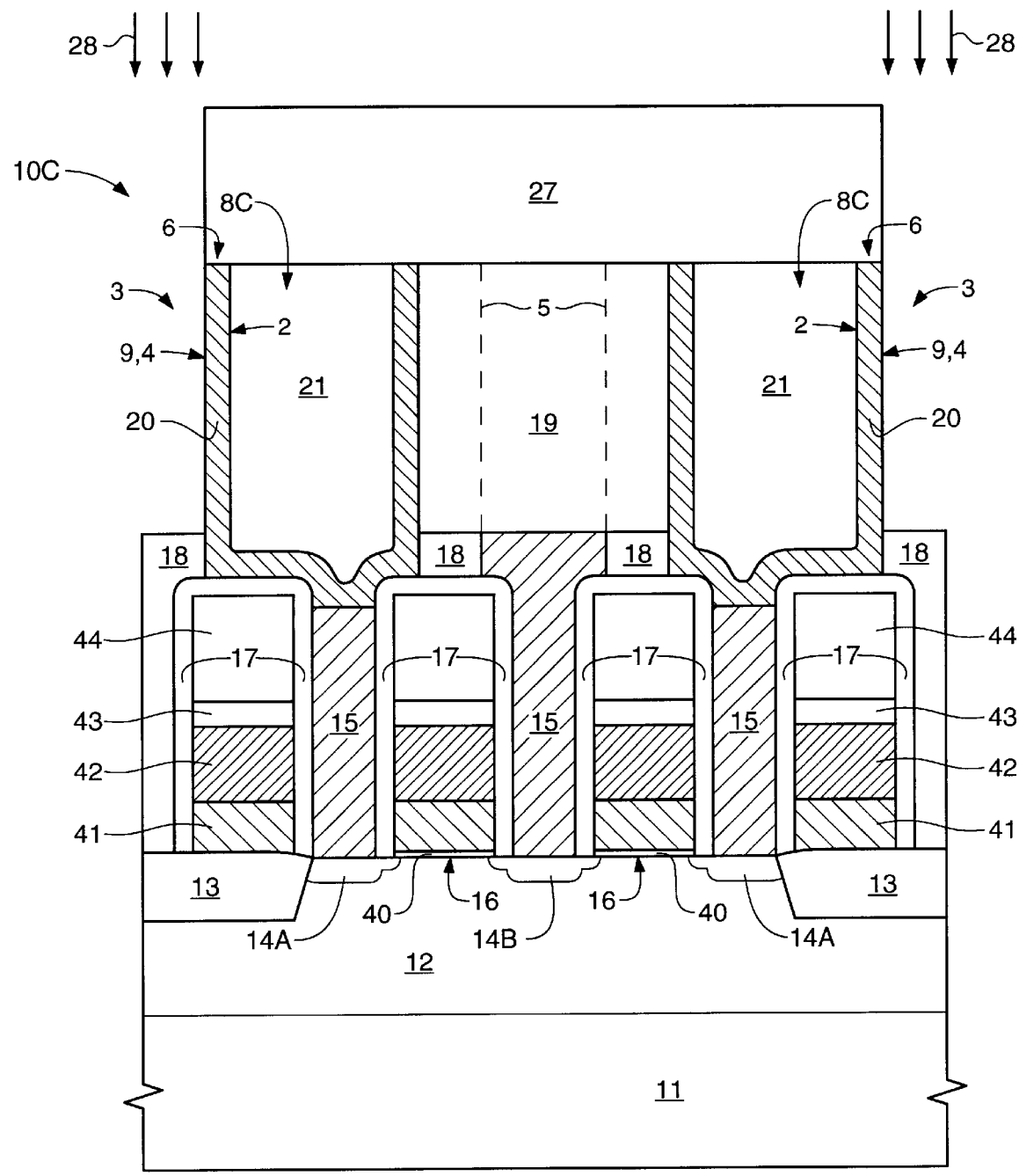

Referring to FIG. 14, there is shown a cross-sectional view along III—III of in-process DRAM substrate assembly 10C. Etch mask 27 may be deposited and patterned on in-process substrate assembly 10C. Etch mask 27 may comprise a multi-layer resist (MLR) or single layer of a photosensitive polymer. Further, etch mask 27 may extend to exterior surface 9 of bottom container capacitor electrodes of in-process container capacitors 8C. Though etch mask 27 is illustratively shown extending to exterior surface portions 4, it need only cover a portion of dielectric layer 19 extending from the contact site 5 to the nearest part of the neighboring conductive layers 20. In fact, it may be preferable to have an etch mask 27 that is narrower than the one depicted in order to avoid the need for precise alignment with the exterior surface portions 4 facing away from contact site 5. An etch mask 27 as wide as the one depicted risks misalignment, which could block subsequent desired etching of dielectric 19 immediately external to one of the exterior surface portions 4.

Accordingly, a portion of dielectric layer 19 is removed by etch 28 as guided by etch mask 27. Etch 28 provides recesses 3 between adjacent bottom container capacitor electrodes. This etch 28 may extend to some level above, down to, or into dielectric layer 18. Thus, it may be advantageous to form dielectric layers 18 and 19 of different materials for purposes of etch selectivity. Moreover, if dielectric layer 18 is removed to a point where some portion of cap 44 or spacer 17 is exposed, etching selective to the material forming cap 44 or spacer 17 may be desirable. By way of example and not limitation, if dielectric layer 19 is BPSG and is to be etched down to a level above a BPSG dielectric layer 18, a silicon oxide etch selective to conductive layer 20 of conductive polysilicon may be used.

Figure 15:
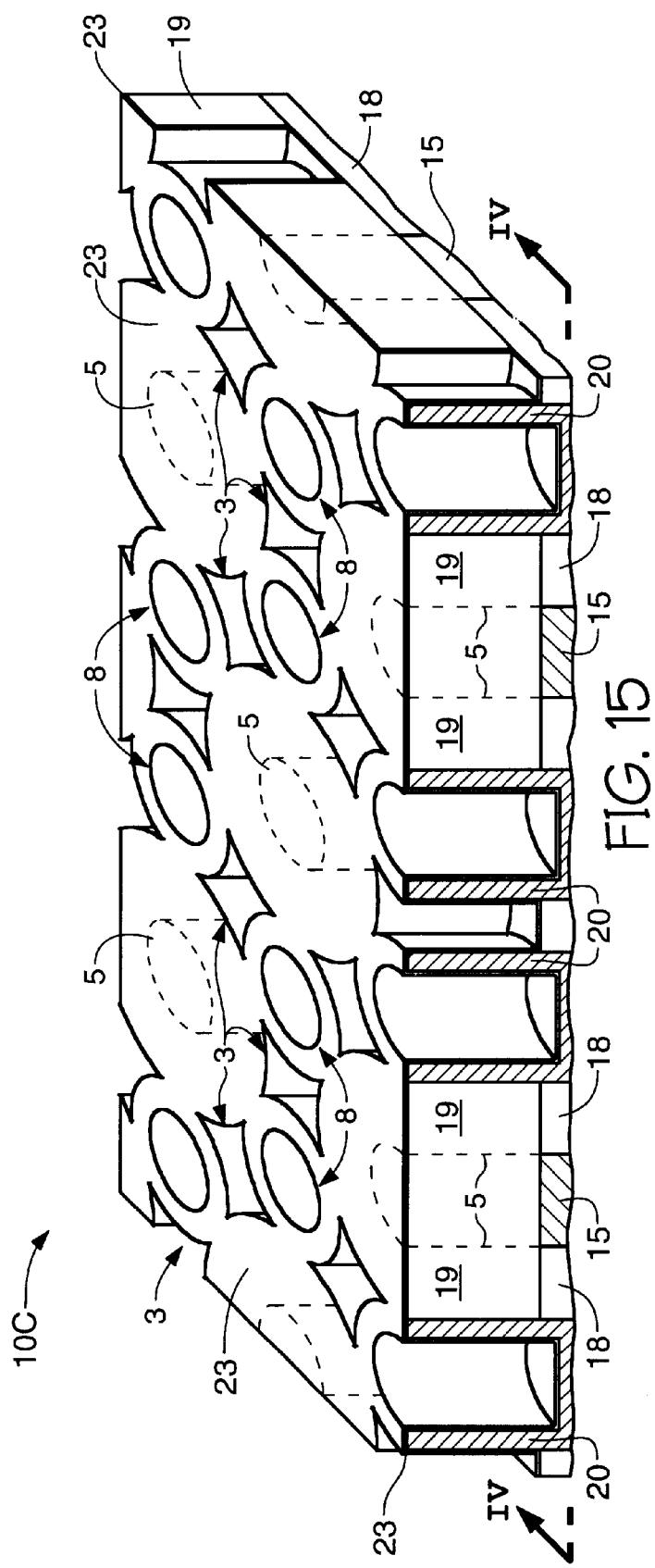

Referring FIG. 15, there is shown a three-dimensional view along cross-section IV—IV of the in-process DRAM substrate assembly 10C after removing flow-fill material 21 and etch mask 27. Capacitor dielectric 23 is deposited onto the interior of the cup-shaped bottom electrodes 20 as well as onto the recesses 3. Moreover, the capacitor dielectric is deposited over the dielectric layer 19 remaining between each contact site 5 and its surrounding electrodes. Preferably, capacitor dielectric 23 is conformal within plus or minus five angstroms. Capacitor dielectric 23 is formed of one or more layers of one or more materials. Capacitor dielectric 23 may be a nitride film, a tantalum oxide, or another form of dielectric. Notably, if an oxide is used for capacitor dielectric 23, and conductive layer 20 is formed of a material which allows oxygen to diffuse or which forms a dielectric with oxygen, then an oxygen barrier layer may be formed as part of capacitor dielectric 23. By way of example and not limitation, if conductive layer 20 is formed of HSG, then an rapid thermal nitridization (RTN) process may be used to seal bottom electrode from oxygen. A phosphine or an arsine gas may be used during RTN to reduce depletion of phosphorus or arsenic respectively, in HSG. In this embodiment, a nitride film or a tantalum oxide film equal to or less than 6 nm (60 angstroms) thick may be deposited followed by exposure to a dry or a wet oxygenated environment.

Figure 16:
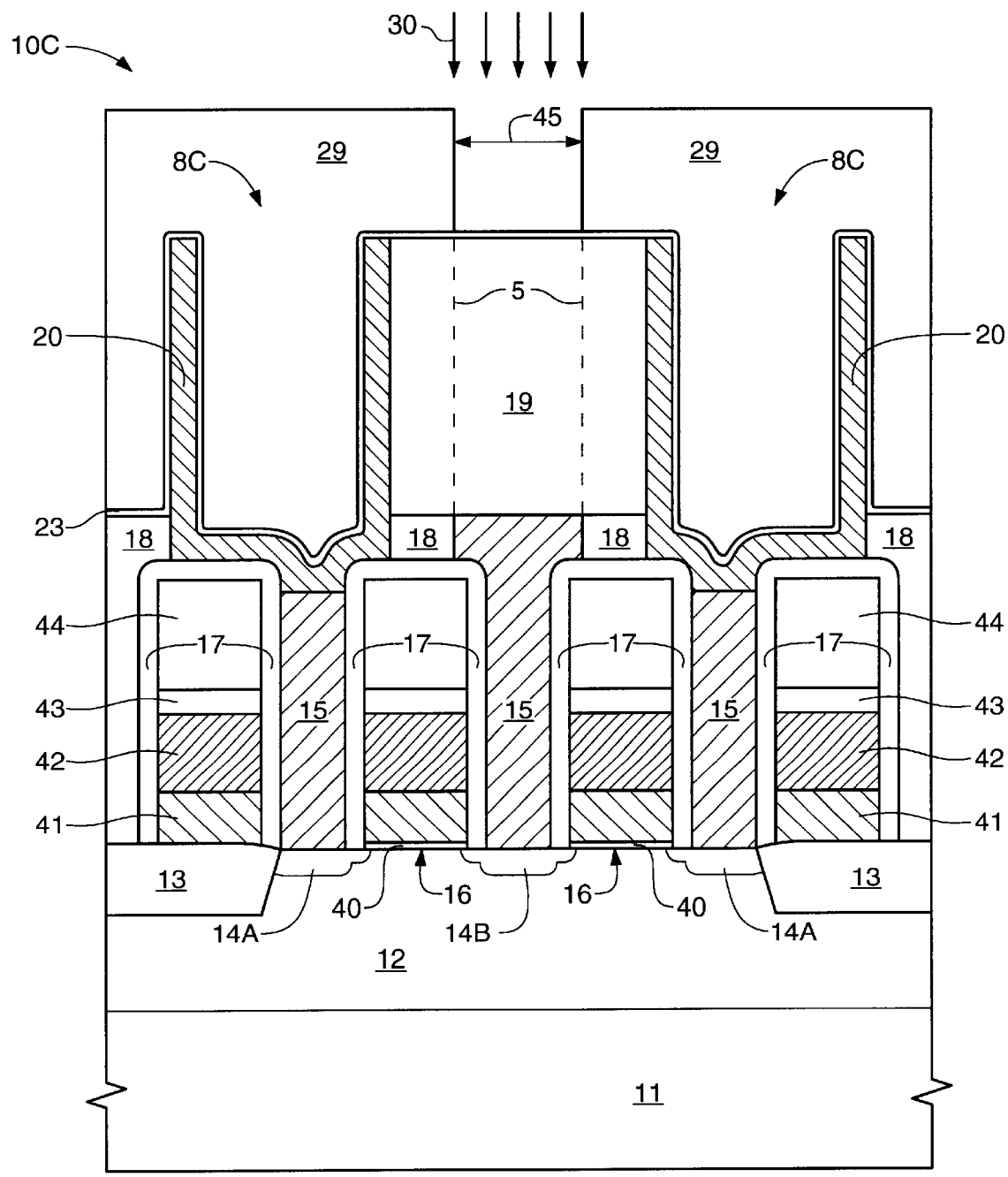

After forming capacitor dielectric 23, FIG. 16 illustrates that etch mask 29 is subsequently deposited and patterned. Etch mask 29 may comprise an MLR or a single layer of a photosensitive polymer. Etch 30 is used to a remove portions of capacitor dielectric layer 23 and dielectric layer 19 from contact site 5, as indicated by the dashed lines.

Figure 17:
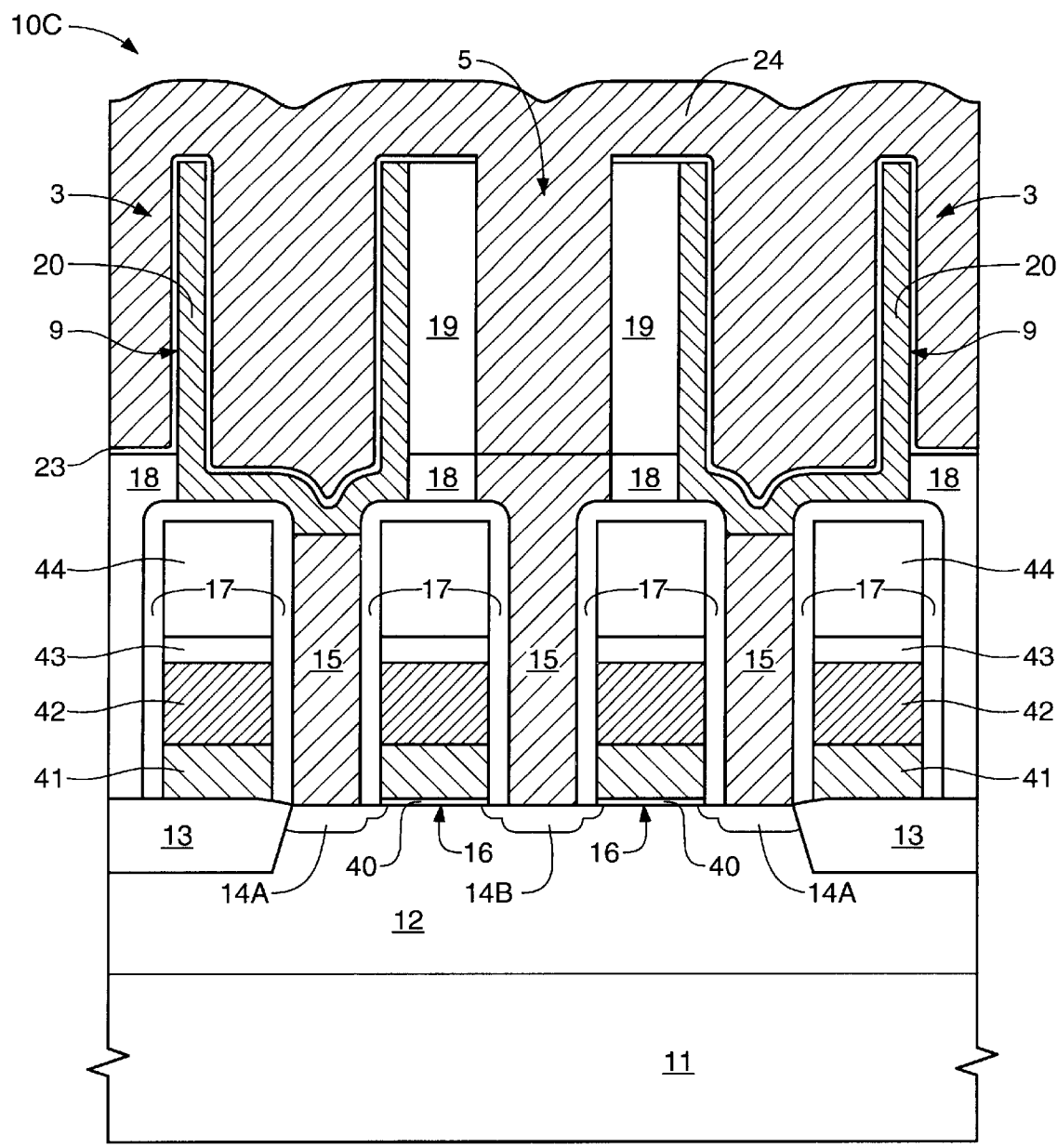

After forming a hole at contact site 5, etch mask 29 is removed and conductive layer 24 is deposited, as illustratively shown in the cross-sectional view of FIG. 17. Specifically in this exemplary embodiment, conductive layer 24 deposits into (1) the contact site 5; (2) the interior of the cup shape, defined by the conductive layer 20 and its overlying dielectric 23; and (3) the recesses 3. Due to the presence of the dielectric layer 19 in the area between the contact site 5 and the neighboring bottom electrodes (defined by conductive layers 20), the conductive layer 24 does not deposit in that area. Rather, it deposits over the dielectric layer 19. As a result, conductive layer 24 is formed to provide a second electrode of each container capacitor structure and a contact structure. Further, in providing a second electrode, this exemplary process allows for capacitance using a portion of a particular bottom electrode's exterior surface 9 that is askew from the contact site 5 in addition to the capacitance that can be generated in the interior of the bottom electrode. Still further, another portion of the bottom electrode's exterior surface 9 facing the contact site 5 remains free of the second electrode material; this helps prevent shorts to the contact site 5 as well as other defects that may arise from close spacing between conductive materials.

Conductive layer 24 may comprise one or more layers of one or more materials. A polysilicon, with N-type or P-type impurities added thereto for conductivity, may be used. However, a platinum, ruthenium, ruthenium oxide-like material may be used. Notably, if a conductive nitride or oxide is used, a barrier material (not shown), such as titanium nitride or tungsten nitride, may be located between conductive stud 15 and conductive layer 24 to prevent oxidation of the former. Notably, at least a portion of a conductive plug and a container capacitor top electrode may be formed with one deposition. Of further note is that the deposition allows for double-sided capacitance at portions of the capacitors facing away from contact sites.

Figure 18A:
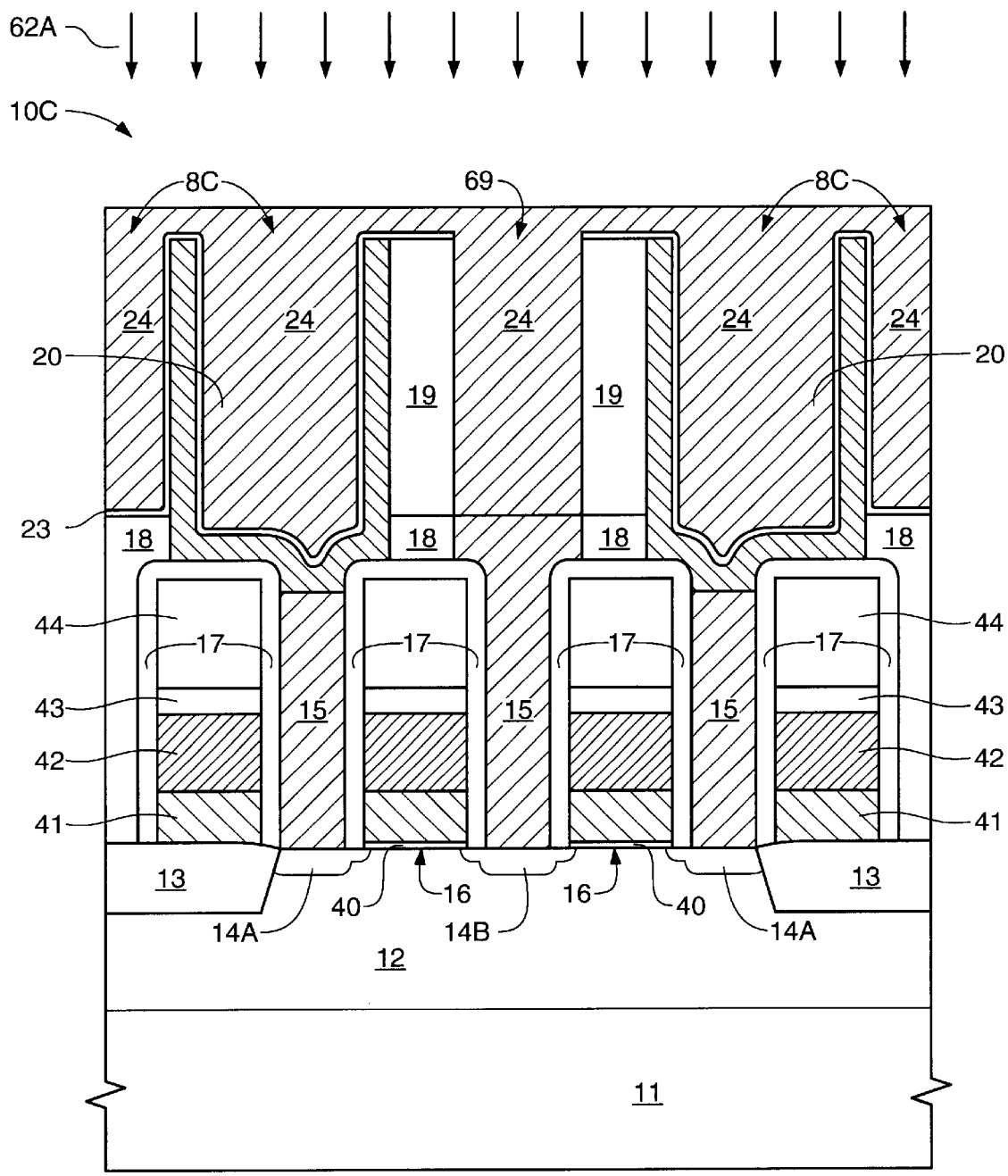
Figure 18B:
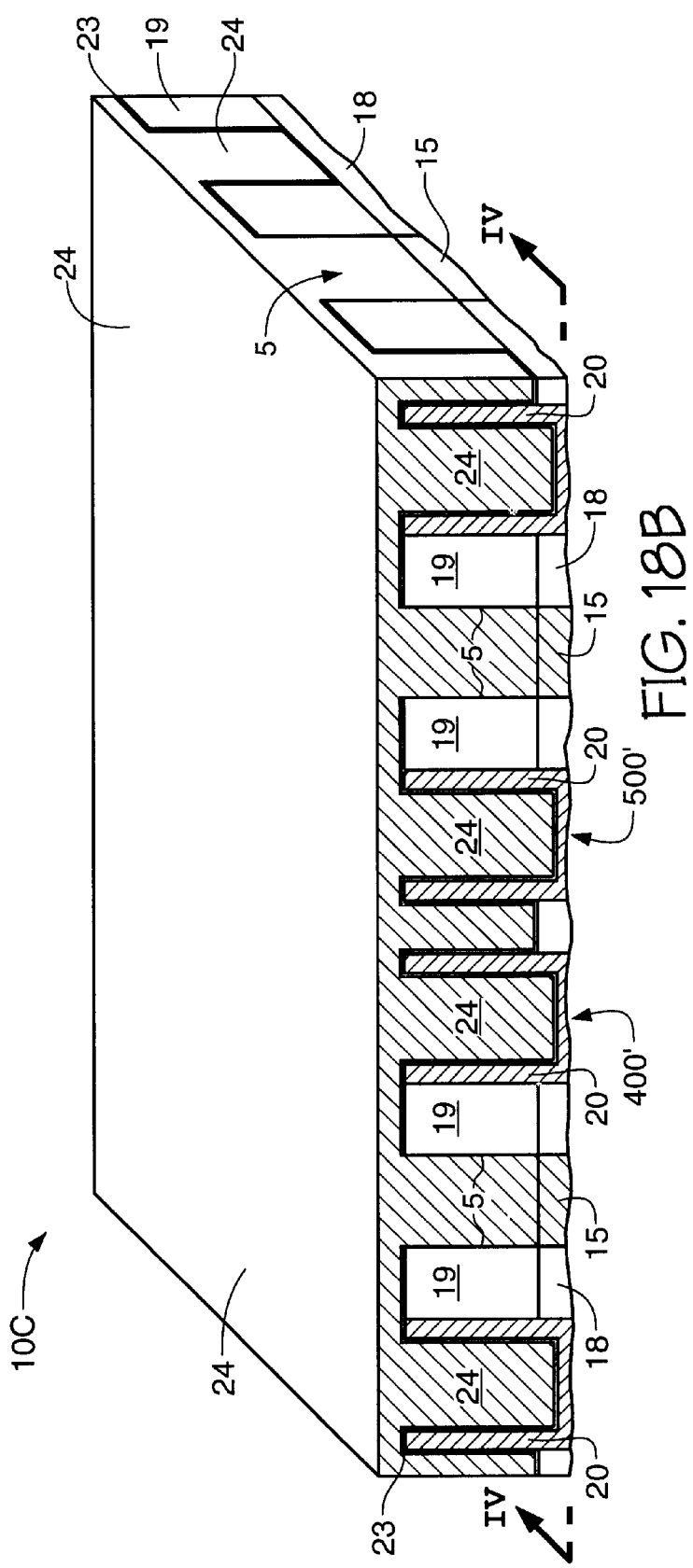

Referring to FIG. 18A, there is shown a cross-sectional view of substrate assembly 10C after etch 62A. Notably, CMP may be used in conjunction with or instead of etch 62A to make conductive layer 24 of substrate assembly 10C more planar. An upper portion of conductive layer 24 is left connecting a top electrode of container capacitors 8C with contact plug 69. FIG. 18B offers a three-dimensional perspective, again showing a cross-section along axis IV—IV. The additional capacitance offered in this embodiment can be further understood with this figure, especially when compared to FIG. 5B, which shows a similar cross-section of a previously-discussed embodiment. In that earlier figure, dielectric layer 19 interposes between bottom electrodes 400 and 500. In contrast, FIG. 18B indicates that the top electrode, courtesy of conductive layer 24, and capacitor dielectric 23 interpose between bottom electrodes 400' and 500', thereby contributing to the capacitance of the devices that will be formed from those elements.

Referring to FIG. 19, there is shown a cross-sectional view of in-process DRAM substrate assembly 10C after depositing and patterning etch mask 99. Etch 62A or 62B is s employed as described in a previous embodiment—to remove conductive layer 24 from around the contact sites 5. Further processing of substrate assembly 10C may be done as described elsewhere herein with respect to forming yet another conductive layer in bit line trenches.

Figure 20:
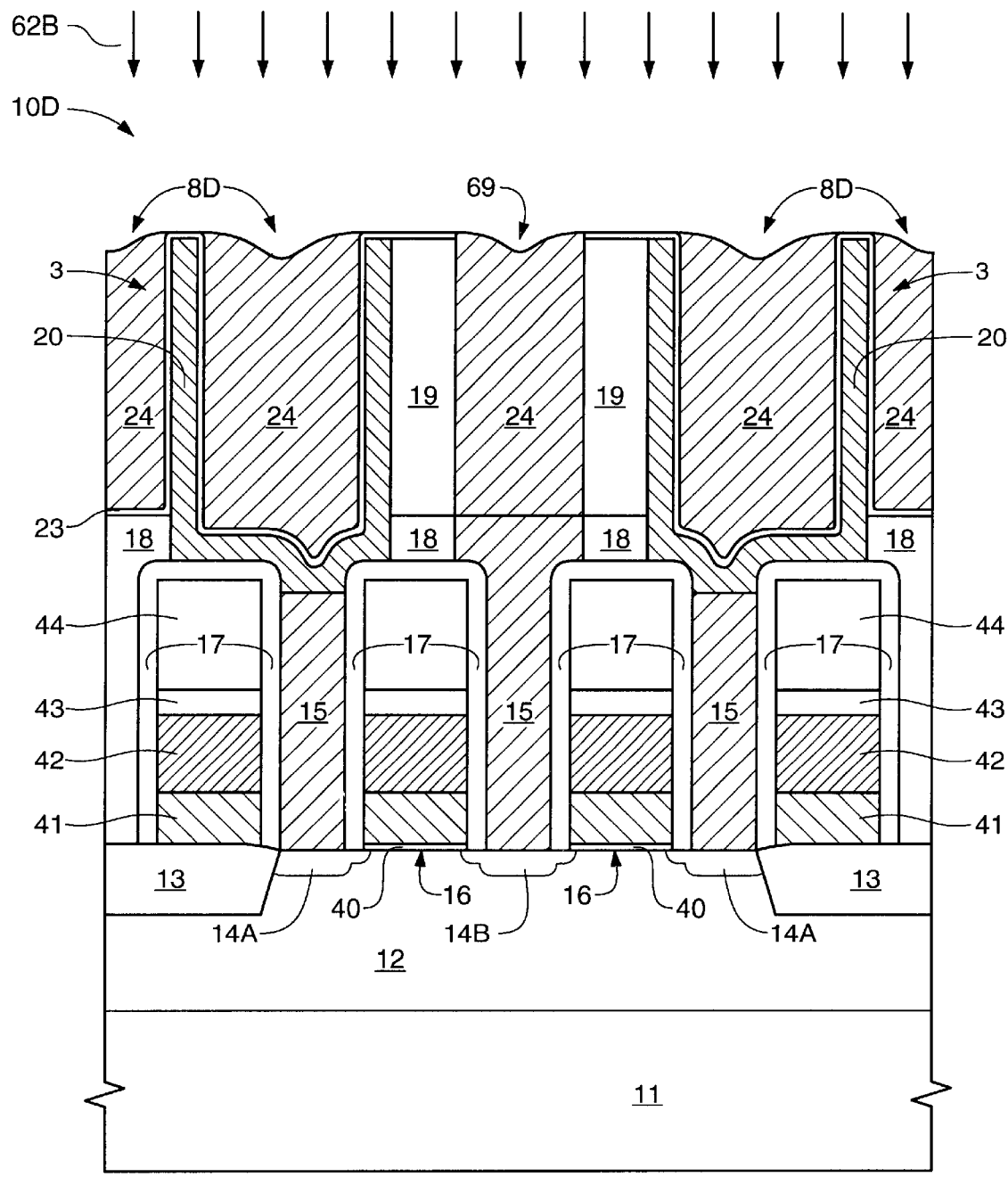
FIGS. 20–21 demonstrate a fourth exemplary process embodiment of the current invention from various viewpoints.

As an alternative to retaining an upper portion of conductive layer 24, a fourth embodiment allows etch 62B to remove that upper portion of conductive layer 24, thereby disconnecting conductive plug 69 from the top electrodes of container capacitors 8D. The result of this alternative can be seen in FIG. 20. Subsequent steps in this exemplary embodiment are analogous to those of the second embodiment described above. Specifically, referring to FIG. 21, dielectric layer 50 and conductive layer 51 are formed and patterned in a manner such as the one described for FIG. 10. Accordingly, providing bit line trenches and filling them with conductive material may be performed in the manner used to describe FIGS. 11 and 12.

The present invention is particularly well-suited for high-density memory array architectures. Such a high-density memory array architecture may have adjacent bit lines with a pitch equal to or less than 0.5 microns. Though a bit line over contact formation is described herein, it should be understood that a buried bit line architecture may be used as an alternative. In a high-density memory array, critical dimension (CD) of a contact may be equal to or less than 0.32 microns wide, and word line-to-word line pitch in such an array may be equal to or less than 0.5 microns.

Figure 22:
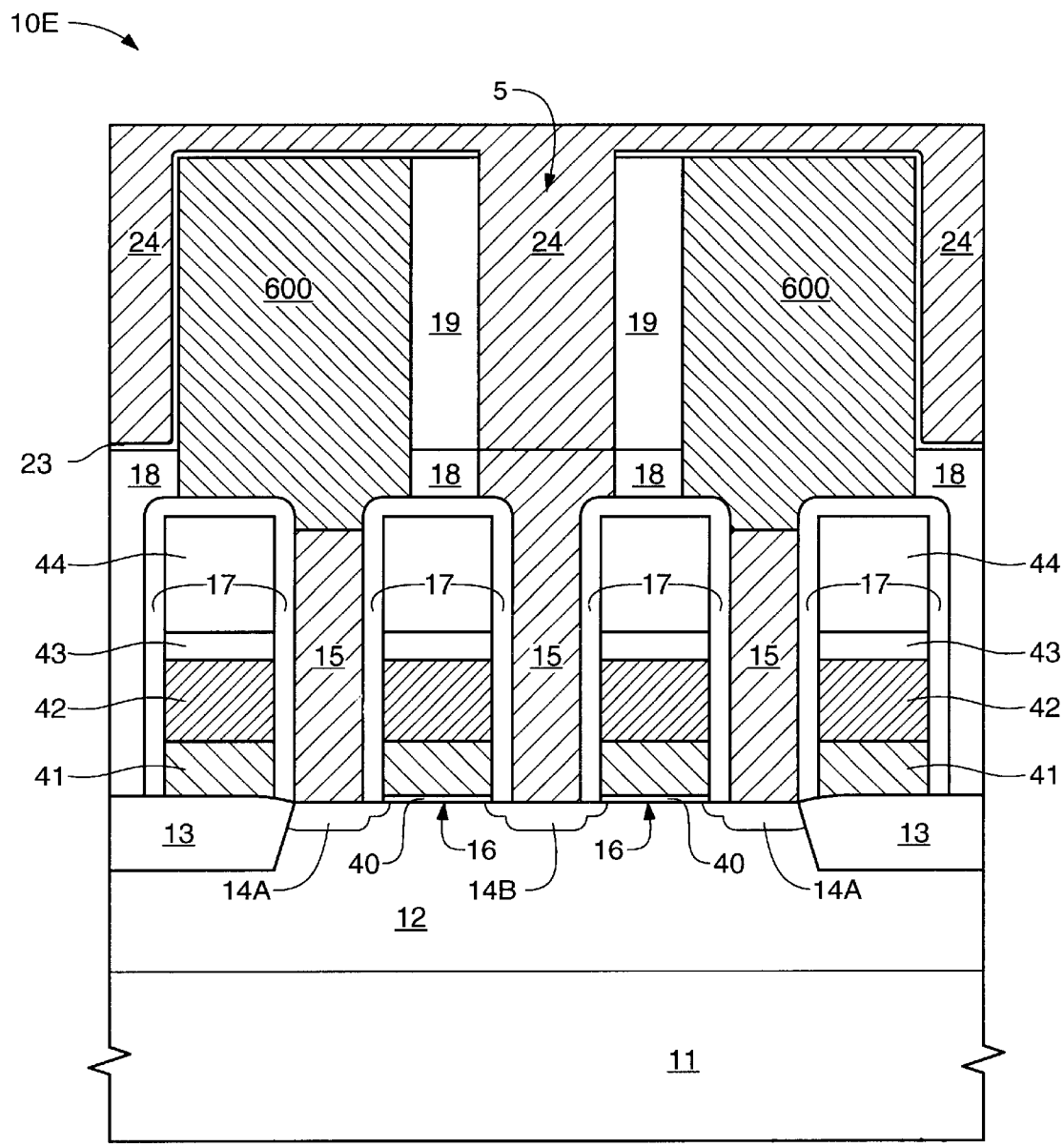
FIG. 22 illustrates another exemplary apparatus embodiment.

While the above-described embodiments of the present invention were directed to DRAM manufacture, the present invention may be implemented in a variety of other integrated circuit devices (memory devices, logic devices having embedded memory, application specific integrated circuits, microprocessors, microcontrollers, digital signal processors, and the like incorporating a memory array)

which employ one or more container capacitors. Moreover, a memory or a memory module having a container capacitor formed in accordance with the present invention may be employed in various types of information handling systems (network cards, telephones, scanners, facsimile machines, routers, televisions, video cassette recorders, copy machines, displays, printers, calculators, and personal computers, and the like incorporating memory). In addition, the current invention is not limited to container capacitors. Also included within the scope are other non-planar devices or devices having a component that is vertical with respect to the underlying support surface. FIG. 22, for example, illustrates an in-process substrate assembly 10E including stud capacitors rather than container capacitors, wherein studs 600 are made of a conductive material and serve as the bottom electrode. The portion of a stud 600 facing the contact site 5 are free of conductive layer 24, whereas portions facing away from a contact site 5 allow for capacitance to be generated using the exterior of the stud 600. This can be achieved using methods such as the ones described above for a container capacitor.

The present invention has been particularly shown and described with respect to certain preferred embodiments. However, it will be readily appreciated to those of ordinary skill in the art that a wide variety of alternate embodiments, adaptations or variations of the preferred embodiments, or equivalent embodiments may be made without departing from the intended scope of the present invention as set forth in the appended claims. For example, while it is preferred to avoid providing additional conductive material between the bottom electrode of a vertical capacitor and a conductive plug, it is not a requirement of the current invention. Consequently, the current invention encompasses embodiments wherein a vertical capacitor's exterior portion facing a conductive plug contribute to capacitance. In the case of a container capacitor, this can allow for double-sided capacitance throughout the entire vertical area of the capacitor. Moreover, it is not necessary that the electrode deposited be the top electrode. Accordingly, the present invention is not limited except as by the appended claims.

What is claimed is:

1. A method of forming a plurality of memory cell components, comprising:

providing a layer of insulation over a substrate;

providing a bottom plate of a container capacitor within said insulation, wherein said bottom plate defines a capacitor interior;

lining at least said capacitor interior with a dielectric;

forming a contact hole in said insulation; and simultaneously filling said contact hole and said capacitor interior with a conductive material, wherein said step of simultaneously filling said contact hole and said capacitor interior comprises overfilling said contact hole and said capacitor interior with said conductive material.

2. The method in claim 1, further comprising:

retaining said conductive material above said capacitor interior;

removing said conductive material above said contact hole; and providing a conductive member contacting said conductive material in said contact hole and insulated from said conductive material above said capacitor interior.

3. The method in claim 1, further comprising:

removing said conductive material above said contact hole and above said capacitor interior;

providing additional conductive material over said capacitor interior; and providing a conductive member contacting said conductive material in said contact hole and insulated from said additional conductive material above said capacitor interior.

\* \* \* \* \*